US011943974B2

(12) United States Patent
Seon et al.

(10) Patent No.: US 11,943,974 B2
(45) Date of Patent: Mar. 26, 2024

(54) DISPLAY PANEL

(71) Applicant: Samsung Display Co., Ltd., Yongin-si (KR)

(72) Inventors: Jongbaek Seon, Yongin-si (KR); Jaehak Lee, Yongin-si (KR); Juncheol Shin, Yongin-si (KR); Kyungchan Chae, Yongin-si (KR); Jieun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 94 days.

(21) Appl. No.: 17/674,602

(22) Filed: Feb. 17, 2022

(65) Prior Publication Data

US 2022/0173187 A1 Jun. 2, 2022

Related U.S. Application Data

(63) Continuation of application No. 16/823,224, filed on Mar. 18, 2020, now Pat. No. 11,348,985.

(30) Foreign Application Priority Data

Jun. 19, 2019 (KR) .................. 10-2019-0073101

(51) Int. Cl.
*H01L 27/32* (2006.01)
*H10K 50/84* (2023.01)
(Continued)

(52) U.S. Cl.
CPC ........... *H10K 59/124* (2023.02); *H10K 50/84* (2023.02); *H10K 59/122* (2023.02);
(Continued)

(58) Field of Classification Search
CPC . H01L 51/56; H01L 51/5237; H01L 27/3258; H01L 27/3246; H01L 27/3248; H01L 27/3276
See application file for complete search history.

(56) References Cited

U.S. PATENT DOCUMENTS 7,935,977 B2   5/2011 Lee et al.
8,164,252 B2   4/2012 Lee et al.
(Continued)

FOREIGN PATENT DOCUMENTS

EP    3454389 A1    3/2019
EP    3565004 A1    11/2019
(Continued)

*Primary Examiner* — Nicholas J Tobergte
(74) *Attorney, Agent, or Firm* — Lewis Roca Rothgerber Christie LLP

(57) ABSTRACT

A display panel includes: a substrate including a first area, a second area, and a third area; a stacked structure corresponding to a plurality of display elements in the second area, the stacked structure including a pixel electrode, an opposite electrode, and an intermediate layer between the pixel electrode and the opposite electrode; and a plurality of grooves in the third area, wherein the stacked structure includes at least one organic material layer that is disconnected by the plurality of grooves, at least one groove of the plurality of grooves is defined in a first multi-layer including a first lower layer and a first upper layer, and at least one of the first lower layer and the first upper layer includes a plurality of sub-layers.

21 Claims, 30 Drawing Sheets

(51) Int. Cl.
  *H10K 59/122* (2023.01)
  *H10K 59/123* (2023.01)
  *H10K 59/124* (2023.01)
  *H10K 59/131* (2023.01)
  *H10K 71/00* (2023.01)
  *H10K 102/00* (2023.01)

(52) U.S. Cl.
  CPC ......... *H10K 59/123* (2023.02); *H10K 59/131* (2023.02); *H10K 71/00* (2023.02); *H10K 2102/00* (2023.02)

(56) References Cited

U.S. PATENT DOCUMENTS

| | | | |
|---|---|---|---|
| 8,947,627 B2 | 2/2015 | Rappoport et al. | |
| 9,449,553 B2 | 9/2016 | Kwak et al. | |
| 9,997,738 B2 | 6/2018 | Choi et al. | |
| 10,108,149 B2 | 10/2018 | Kang et al. | |
| 10,128,461 B2 | 11/2018 | Kang et al. | |
| 10,205,122 B2 | 2/2019 | Choi et al. | |
| 10,304,913 B2 | 5/2019 | Choi et al. | |
| 10,541,380 B1 | 1/2020 | Sung et al. | |
| 10,873,053 B2 | 12/2020 | Sung et al. | |
| 10,916,588 B2 | 2/2021 | Kang et al. | |
| 11,374,200 B2 * | 6/2022 | Seon | H10K 50/844 |
| 11,711,949 B2 * | 7/2023 | Heo | H10K 50/844 257/72 |
| 2005/0037550 A1 | 2/2005 | Kang et al. | |
| 2014/0176895 A1 * | 6/2014 | Park | G02F 1/133512 438/30 |
| 2016/0044103 A1 | 2/2016 | Seo et al. | |
| 2017/0040537 A1 * | 2/2017 | Lee | H01L 21/67173 |
| 2017/0148856 A1 | 5/2017 | Choi et al. | |
| 2017/0150618 A1 | 5/2017 | Choi et al. | |
| 2017/0162111 A1 | 6/2017 | Kang et al. | |
| 2017/0162637 A1 | 6/2017 | Choi et al. | |
| 2017/0237037 A1 | 8/2017 | Choi et al. | |
| 2017/0237038 A1 | 8/2017 | Kim et al. | |
| 2017/0288004 A1 | 10/2017 | Kim et al. | |
| 2018/0033830 A1 | 2/2018 | Kim et al. | |
| 2018/0151834 A1 | 5/2018 | Kanaya | |
| 2018/0183015 A1 | 6/2018 | Yun et al. | |
| 2019/0245159 A1 | 8/2019 | Kim et al. | |
| 2020/0006701 A1 | 1/2020 | Lee et al. | |
| 2020/0106045 A1 | 4/2020 | Han et al. | |
| 2020/0119304 A1 * | 4/2020 | Choi | H10K 59/80 |
| 2020/0403180 A1 | 12/2020 | Seon et al. | |
| 2021/0111374 A1 | 4/2021 | Sung et al. | |
| 2022/0102678 A1 * | 3/2022 | Kim | H10K 50/171 |

FOREIGN PATENT DOCUMENTS

| | | |
|---|---|---|
| EP | 3588571 A1 | 1/2020 |
| EP | 3 683 841 A2 | 7/2020 |
| JP | 4678319 | 2/2011 |
| KR | 2003-0031398 | 4/2003 |
| KR | 10-0761077 | 9/2007 |
| KR | 10-0859084 B1 | 9/2008 |
| KR | 10-2010-0007266 | 1/2010 |
| KR | 10-2016-0016360 | 2/2016 |
| KR | 10-2016-0076688 | 7/2016 |
| KR | 10-2016-0147116 | 12/2016 |
| KR | 10-2017-0019553 | 2/2017 |
| KR | 10-2017-0059527 | 5/2017 |
| KR | 10-2017-0059537 | 5/2017 |
| KR | 10-2017-0059864 | 5/2017 |
| KR | 10-2017-0065059 | 6/2017 |
| KR | 10-2017-0066767 A | 6/2017 |
| KR | 10-2017-0095444 | 8/2017 |
| KR | 10-2018-0013369 | 2/2018 |
| KR | 10-2018-0014398 | 2/2018 |
| KR | 10-2018-0047607 | 5/2018 |
| KR | 10-2020-0003336 A | 1/2020 |

* cited by examiner

DISPLAY PANEL

CROSS-REFERENCE TO RELATED APPLICATIONS

This application is a continuation of U.S. patent application Ser. No. 16/823,224, filed Mar. 18, 2020, now U.S. Pat. No. 11,348,985, which claims priority to and the benefit of Korean Patent Application No. 10-2019-0073101, filed Jun. 19, 2019, the entire content of both of which is incorporated herein by reference.

BACKGROUND

1. Field

One or more embodiments relate to a display panel including a first area inside a display area.

2. Description of Related Art

Recently, the use of a display device has become more diversified. Also, as display devices have become thinner and more lightweight, their range of use has gradually been extended.

As an area occupied by a display area of a display device increases, functions that may be combined or associated with the display device are being added to. As a way for adding various functions while extending an area, research into a display device in which various elements may be arranged in a display area is in progress.

The above information disclosed in this Background section is only for enhancement of understanding of the background and therefore the information discussed in this Background section does not necessarily constitute prior art.

SUMMARY

One or more example embodiments include a display panel including a first area in which various kinds of components may be arranged inside a display area, and a display device including the display panel. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to one or more example embodiments, a display panel includes: a substrate including a first area, a second area, and a third area between the first area and the second area; a stacked structure corresponding to a plurality of display elements located in the second area, the stacked structure including a pixel electrode, an opposite electrode, and an intermediate layer between the pixel electrode and the opposite electrode; and a plurality of grooves located in the third area, wherein the stacked structure includes at least one organic material layer, the at least one organic material layer is disconnected by the plurality of grooves, at least one groove of the plurality of grooves is defined in a first multi-layer including a first bottom layer and a first top layer, and at least one of the first bottom layer and the first top layer includes a plurality of sub-layers.

According to some example embodiments, the first top layer may include an inorganic material layer.

According to some example embodiments, the first top layer may include a conductive oxide layer, a metal layer, or an inorganic insulating layer.

According to some example embodiments, the first bottom layer may include: a first sub-bottom layer including an organic insulating material; and a second sub-bottom layer under the first sub-bottom layer.

According to some example embodiments, the display panel may further include: a transistor between the substrate and the plurality of display elements; a first organic insulating layer and a second organic insulating layer between the transistor and the pixel electrode; and a pixel-defining layer on the pixel electrode.

According to some example embodiments, the first sub-bottom layer may include the same material as the second organic insulating layer, and the second sub-bottom layer may include the same material as the first organic insulating layer.

According to some example embodiments, the display panel may further include: a second multi-layer including a second bottom layer and a second top layer, a first groove of the plurality of grooves may be defined in the second multi-layer, wherein the second bottom layer may include a third sub-bottom layer including the same material as the pixel-defining layer; and a fourth sub-bottom layer including the same material as the second organic insulating layer.

According to some example embodiments, the first groove may overlap a plurality of data lines across the third area.

According to some example embodiments, the display panel may further include: at least one inorganic insulating layer between the substrate and the first organic insulating layer, wherein the first sub-bottom layer may include the same material as the first organic insulating layer, and the second sub-bottom layer may include the same material as the at least one inorganic insulating layer.

According to some example embodiments, the first top layer may include a pair of tips protruding toward a center of the at least one groove.

According to some example embodiments, the first top layer may include: a first sub-top layer including a metal or a conductive oxide; and a second sub-top layer on the first sub-top layer.

According to some example embodiments, a lateral surface of the first sub-top layer that faces the center of the at least one groove may be covered by the second sub-top layer.

According to some example embodiments, the display panel may further include: a first opening located in the first area and passing through the display panel.

According to some example embodiments, the display panel may further include: a thin-film encapsulation layer covering the stacked structure and including an inorganic encapsulation layer and an organic encapsulation layer, wherein the inorganic encapsulation layer may continuously cover an inner surface of each of the plurality of grooves.

According to some example embodiments, a thickness of a first portion of the inorganic encapsulation layer that is located on a top surface of the first top layer may be greater than a thickness of a second portion of the inorganic encapsulation layer that is located on a bottom surface of the first top layer.

According to one or more example embodiments, a display panel includes: a substrate including a first area, a display area, and an middle area between the first area and the display area; a transistor arranged in the display area; a display element including a pixel electrode, an intermediate layer, and an opposite electrode, the pixel electrode being electrically connected to the transistor, the intermediate layer being on the pixel electrode, and the opposite electrode being on the intermediate layer; a first organic insulating layer between the transistor and the pixel electrode, and a second organic insulating layer over the first organic insulating layer; and a plurality of grooves located in the middle area, and disconnecting at least one organic material layer of the intermediate layer, each of the plurality of grooves having an undercut structure, wherein at least one of the plurality of grooves is defined in a first multi-layer, the first multi-layer including a first bottom layer and a first top layer, the first bottom layer including a first sub-bottom layer and a second sub-bottom layer under the first sub-bottom layer, and the first top layer being on the first bottom layer.

According to some example embodiments, the first top layer may include a pair of tips extending toward the at least one groove of the plurality of grooves.

According to some example embodiments, the first sub-bottom layer may include the same material as the second organic insulating layer, and the second sub-bottom layer may include the same material as the first organic insulating layer.

According to some example embodiments, the first top layer may include at least one of a conductive oxide, a metal, and an inorganic insulating material.

According to some example embodiments, a first groove among the plurality of grooves that neighbors the display area may be defined in a second multi-layer including a second bottom layer and a second top layer.

According to some example embodiments, the display panel may further include a pixel-defining layer on the pixel electrode, wherein the second bottom layer may include a fourth sub-bottom layer and a fifth sub-bottom layer, the fourth sub-bottom layer including the same material as the pixel-defining layer, and the fifth sub-bottom layer including the same material as the second organic insulating layer.

According to some example embodiments, the second top layer may include at least one of a conductive oxide, a metal, and an inorganic insulating material.

According to some example embodiments, the first groove may overlap a plurality of data lines across the middle area.

According to some example embodiments, the plurality of data lines may be alternately arranged under the second organic insulating layer.

According to some example embodiments, the first sub-bottom layer may include the same material as the first organic insulating layer, and the second sub-bottom layer may include at least one inorganic insulating layer.

According to some example embodiments, the first top layer may include an inorganic insulating material.

According to some example embodiments, the display panel may further include: a passivation layer arranged between the transistor and the pixel electrode, the passivation layer including an inorganic insulating material, wherein the first top layer may include the same material as the passivation layer.

According to some example embodiments, the first top layer may include: a first sub-top layer; and a second sub-top layer on the first sub-top layer.

According to some example embodiments, the first sub-top layer may include a conductive oxide or a metal, and the second sub-top layer may include an inorganic insulating material.

According to some example embodiments, a lateral surface of the first sub-top layer that faces a center of the at least one groove of the plurality of grooves may be covered by the second sub-top layer.

The above and other aspects and features of certain embodiments of the disclosure will be more apparent from the following description, the drawings, and claims.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
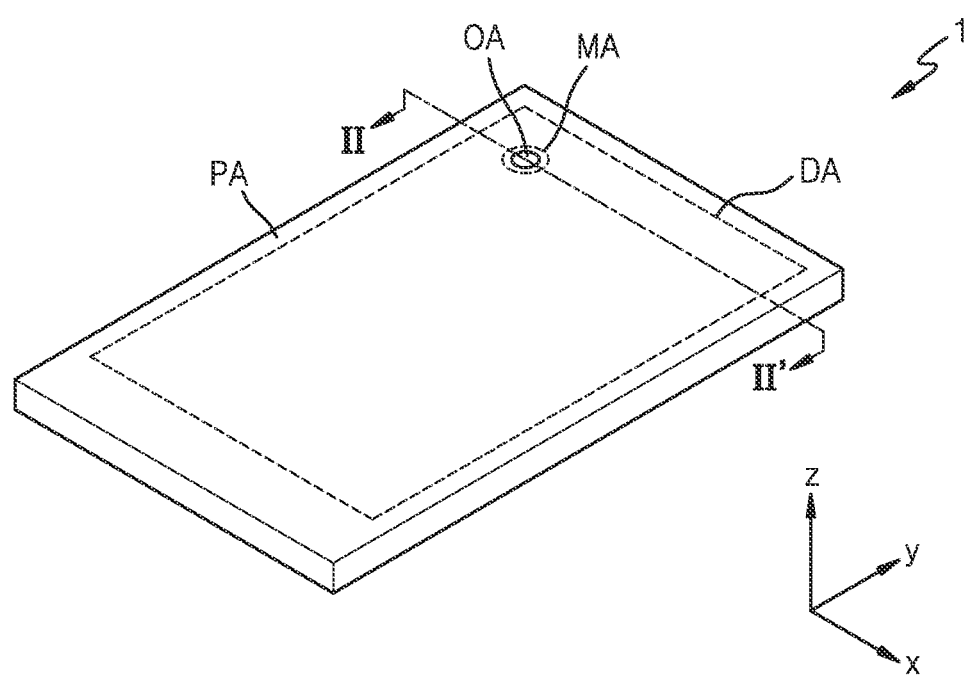
FIG. 1 is a perspective view of a display device according to some example embodiments.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. For example, in the present specification, "at least one of A and B" indicates only A, only B, both A and B, or variations thereof.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present specification, "A and/or B" means A or B, or A and B.

It will be understood that when a layer, region, or component is referred to as being "connected" to another layer, region, or component, it may be "directly connected" to the other layer, region, or component and/or may be "indirectly connected" to other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

FIG. 1 is a perspective view of a display device 1 according to some example embodiments.

Figure 2:
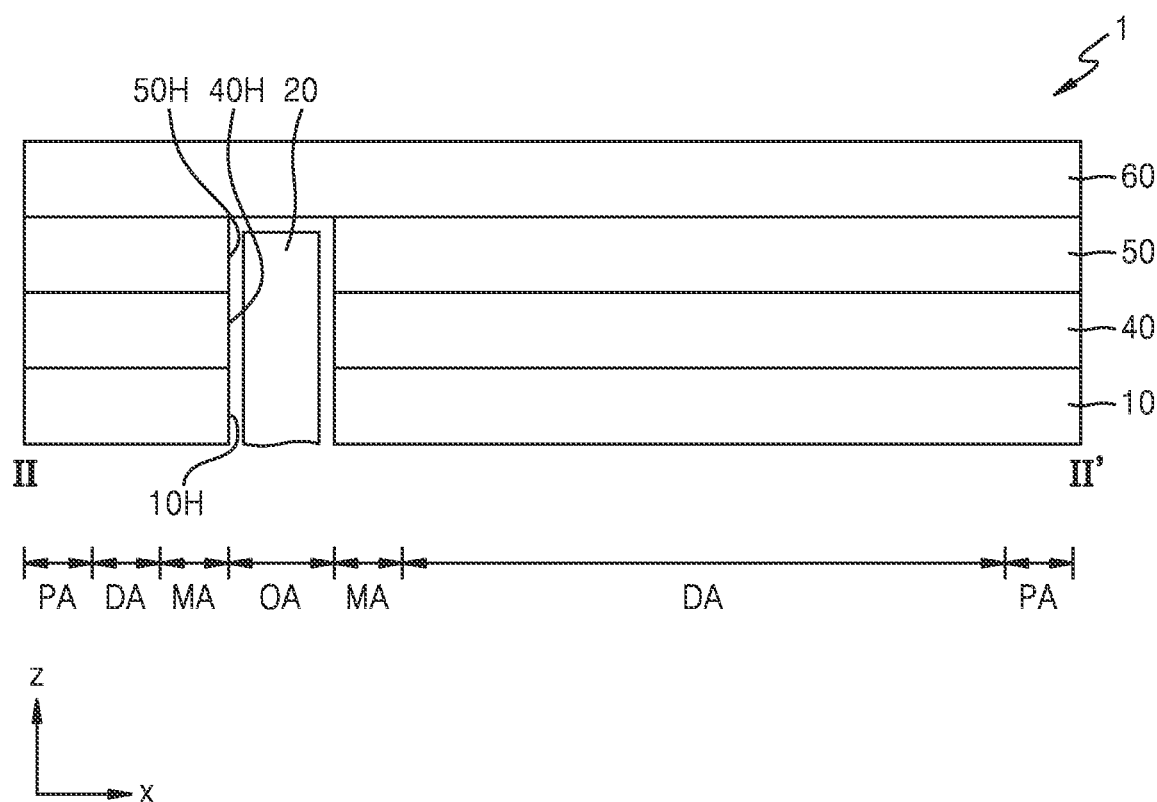
FIG. 2 is a cross-sectional view of a display device according to some example embodiments.

Referring to FIG. 1, the display device 1 includes a first area OA and a display area DA, which is a second area at least partially surrounding the first area OA. The display device 1 may provide an image (e.g., a set or predetermined image) by using light emitted from a plurality of pixels arranged (e.g., located or placed) in the display area DA. The first area OA may be entirely surrounded by the display area DA. The first area OA may be an area in which a component described below with reference to FIG. 2 is arranged or located.

A middle area MA as a third area may be arranged (e.g., located) between the first area OA and the display area DA, which is the second area. The display area DA may be surrounded by a peripheral area PA, which is a fourth area. According to some example embodiments the middle area MA and the peripheral area PA may be a non-display area in which pixels are not placed. The middle area MA may be entirely surrounded by the display area DA, and the display area DA may be entirely surrounded by the peripheral area PA.

Hereinafter, though an organic light-emitting display device is described as an example of the display device 1 according to some example embodiments, the display device is not limited thereto. According to some example embodiments, the display device 1 may be a display device such as an inorganic light-emitting display and a quantum dot light-emitting display.

Though it is shown in FIG. 1 that one first area OA is provided and has a circular shape, the embodiments are not limited thereto. The number of first areas OA may be two or more. Each first area OA may have various shapes such as a circular shape, an elliptical shape, a polygonal shape, a star shape, and a diamond shape.

Figure 3:
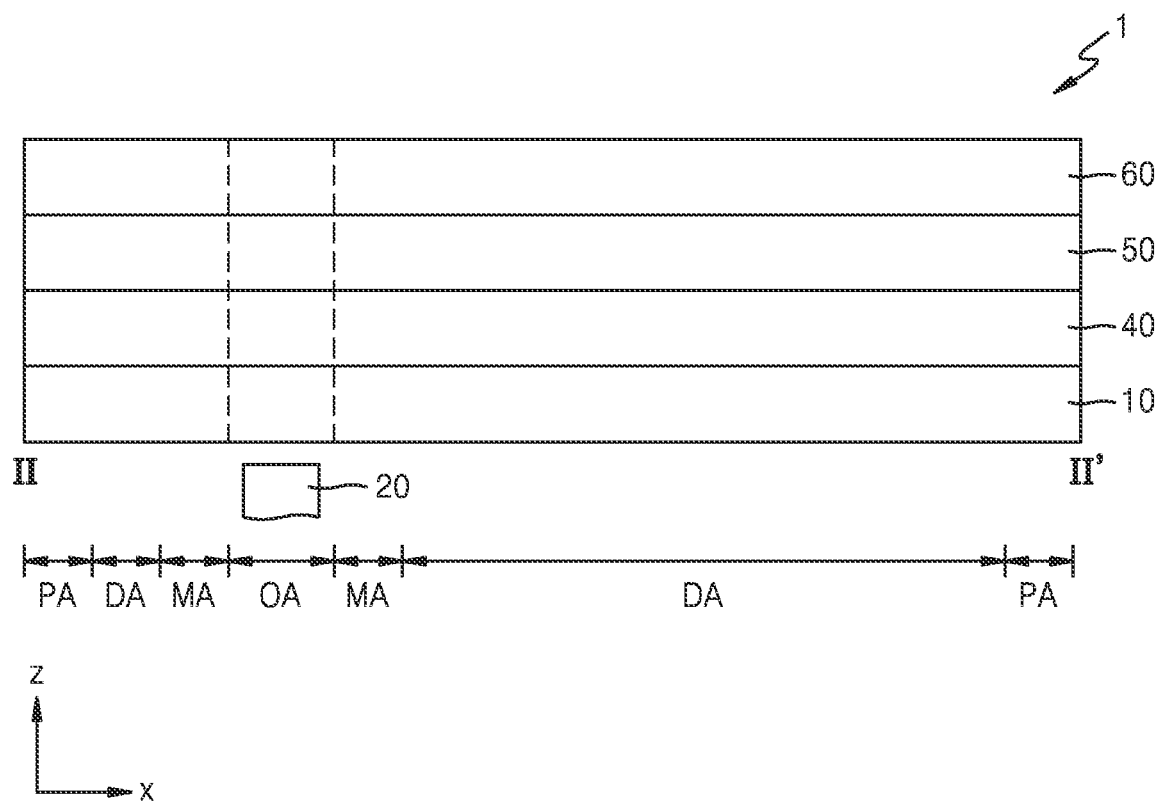
FIG. 3 is a cross-sectional view of a display device according to some example embodiments.

FIGS. 2 and 3 are cross-sectional views of the display device 1 according to some example embodiments, respectively, taken along the line II-II' of FIG. 1.

Referring to FIG. 2, the display device 1 may include a display panel 10, an input sensing layer 40, and an optical functional layer 50 placed on the display panel 10. The display panel 10, the input sensing layer 40, and the optical functional layer 50 may be covered by a window 60. The display device 1 may be various kinds of electronic apparatuses such as mobile phones, notebook computers, and smartwatches.

The display panel 10 may display an image. The display panel 10 includes pixels located in the display area DA. Each of the pixels may include a display element and a pixel circuit connected to the display element. The display element may be an organic light-emitting diode or a quantum dot organic light-emitting diode.

The input sensing layer 40 obtains coordinate information corresponding to an external input, for example, a touch event. The input sensing layer 40 may include a sensing electrode (or a touch electrode) and trace lines, the trace lines being connected to the sensing electrode. The input sensing layer 40 may be on the display panel 10. The input sensing layer 40 may sense an external input by using a mutual cap method and/or a self cap method.

In some embodiments, the input sensing layer 40 may be directly on the display panel 10, or separately formed and then coupled to the display panel 10 by using an adhesive layer such as an optically clear adhesive. For example, the input sensing layer 40 may be successively formed after a process of forming the display panel 10. In this case, the input sensing layer 40 may be a portion of the display panel 10 and an adhesive layer may not be placed between the input sensing layer 40 and the display panel 10. Though it is shown in FIG. 2 that the input sensing layer 40 is located between the display panel 10 and the optical functional layer 50, the input sensing layer 40 may be on the optical functional layer 50 in some other embodiments.

The optical functional layer 50 may include a reflection prevention layer. The reflection prevention layer may reduce reflectivity of the light (e.g., external light) incident towards/on the display panel 10 from the outside through the window 60. The reflection prevention layer may include a retarder and a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals placed in a set or predetermined arrangement. Each of the retarder and the polarizer may further include a protective film. The retarder and the polarizer themselves, or a protective film may be defined as a base layer of the reflection prevention layer.

In some other embodiments, the reflection prevention layer may include a black matrix and color filters. The color filters may be placed by taking into account colors of light emitted respectively from the pixels of the display panel 10. In some other embodiments, the reflection prevention layer may include a destructive interference structure. The destructive interference structure may include a first reflection layer and a second reflection layer respectively placed on different layers. First-reflected light and second-reflected light respectively reflected by the first reflection layer and the second reflection layer may create destructive-interference and thus the reflectivity of external light may be reduced.

The optical functional layer 50 may also include a lens layer. The lens layer may improve emission efficiency of the light emitted from the display panel 10 or reduce color deviation. The lens layer may include a layer having a concave or convex lens shape and/or include a plurality of layers having different refractive indexes. The optical functional layer 50 may include both the reflection prevention layer and the lens layer, or one of these layers.

In an embodiment, the optical functional layer 50 may be successively formed after a process of forming the display panel 10 and/or the input sensing layer 40. In this case, an adhesive layer may not be placed between the optical functional layer 50 and the display panel 10 and/or the input sensing layer 40.

The display panel 10, the input sensing layer 40, and/or the optical functional layer 50 each may include an opening. With regard to this, it is shown in FIG. 2 that the display panel 10, the input sensing layer 40, and the optical functional layer 50 respectively include a first opening 10H, a second opening 40H, and a third opening 50H, the first opening, the second opening 40H, and the third opening 50H overlapping one another. The first opening 10H, the second opening 40H, and the third opening 50H may correspond to the first area OA. In some other embodiments, at least one of the display panel 10, the input sensing layer 40, and the optical functional layer 50 may not include an opening. For example, one or two of the display panel 10, the input sensing layer 40, and the optical functional layer 50 may not include an opening. Alternatively, as shown in FIG. 3, the display panel 10, the input sensing layer 40, and the optical functional layer 50 may not include an opening.

As described above, the first area OA may be a component area (e.g., a sensor area, a camera area, a speaker area, etc.) in which a component 20 is located, the component 20 may add various functions to the display device 1. As shown in FIG. 2, the component 20 may be located inside the first to third openings 10H, 40H, and 50H. Alternatively, as shown in FIG. 3, the component 20 may be located below the display panel 10.

The component 20 may include an electronic element. For example, the component 20 may include an electronic element that uses light or sound. For example, an electronic element may be a sensor such as an infrared sensor that emits and/or receives light, a camera that receives light and captures an image, a sensor that outputs and senses light or sound to measure a distance or recognize a fingerprint, a small lamp that outputs light, or a speaker that outputs sound. An electronic element that uses light may use light in various wavelength bands such as visible light, infrared light, and ultraviolet light. In an embodiment, the first area OA may be a transmission area through which light and/or sound, which are output from the component 20 to the outside or propagate toward the electronic element from the outside, may pass.

In the case where the display device 1 is used as a smartwatch or as an instrument panel for an automobile, the component 20 may be a member such as clock hands or a needle indicating set or predetermined information (e.g., the velocity of a vehicle, etc.). In the case where the display device 1 includes clock hands or an instrument panel for an automobile, the component 20 may pass through the window 60 and may be exposed to the outside. In such a case, the window 60 may include an opening corresponding to the first area OA.

The component 20 may include an element(s) related to a function of the display panel 10 as described above, or may include an element such as an accessory that increases the aesthetic sense of the display panel 10. Though not shown in FIGS. 2 and 3, a layer including an optically clear adhesive may be located between the window 60 and the optical functional layer 50.

FIGS. 4A-4D are cross-sectional views of a display panel according to an embodiment.

Figure 4A:
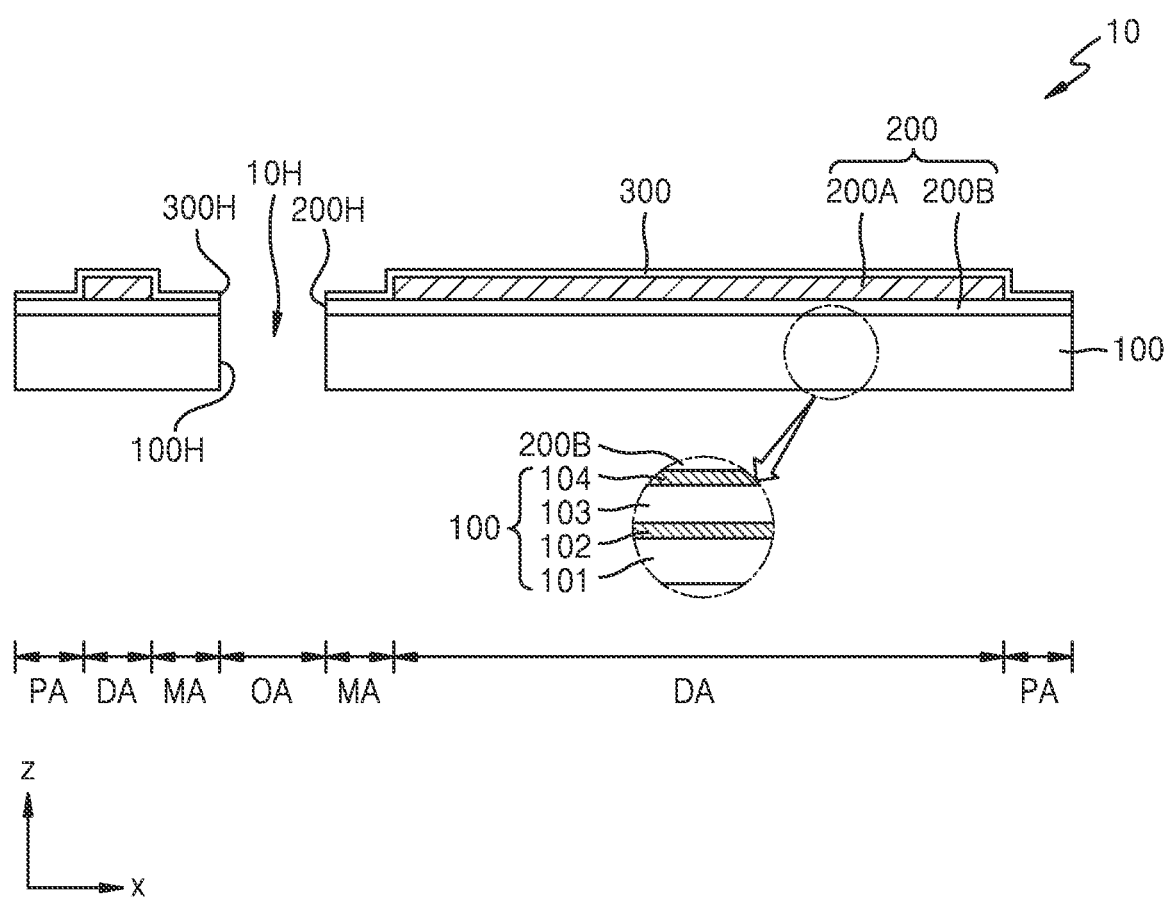
FIGS. 4A-4D are cross-sectional views of a display panel according to some example embodiments.

Referring to FIG. 4A, the display panel 10 includes a display layer 200 located on a substrate 100. The substrate 100 may include a glass material or a polymer resin. The substrate 100 may include a multi-layer. For example, the substrate 100 may include a first base layer 101, a first barrier layer 102, a second base layer 103, and a second barrier layer 104 as shown in an enlarged view of FIG. 4A.

The first base layer 101 and the second base layer 103 each may include a polymer resin. For example, the first base layer 101 and the second base layer 103 may include a polymer resin including polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose tri acetate (TAC), and cellulose acetate propionate (CAP). The polymer resin may be transparent.

The first barrier layer 102 and the second barrier layer 104 are barrier layers reducing or preventing the penetration of external foreign substances and may include a single layer or a multi-layer including an inorganic material such as silicon nitride ($SiN_x$) and silicon oxide ($SiO_x$).

The display layer 200 may include a plurality of pixels. The display layer 200 may include a display element layer 200A and a pixel circuit layer 200B, the display element layer 200A including a display element for each pixel, and the pixel circuit layer 200B including a pixel circuit and insulating layers for each pixel. The display element layer 200A may include a pixel electrode, an opposite electrode, and a stacked structure therebetween. Each display element may be an organic light-emitting diode OLED. Each pixel circuit (e.g., 200B) may include a thin film transistor and a storage capacitor.

Display elements of the display layer 200 may be covered by an encapsulation member such as a thin-film encapsulation layer 300. The thin-film encapsulation layer 300 may include at least one inorganic encapsulation layer and at least one organic encapsulation layer. In the case where the display panel 10 includes the substrate 100 and the thin-film encapsulation layer 300, the substrate 100 including a polymer resin, and the thin-film encapsulation layer 300 including an inorganic encapsulation layer and an organic encapsulation layer, the flexibility of the display panel 10 may be improved.

The display panel 10 may include the first opening 10H passing through the display panel 10. The first opening 10H may be located in the first area OA. In this case, the first area OA may be an opening area. It is shown in FIG. 4A that the substrate 100 and the thin-film encapsulation layer 300 respectively include through holes 100H and 300H each corresponding to the first opening 10H of the display panel 10. The display layer 200 may include a through hole 200H corresponding to the first area OA.

Figure 4B:
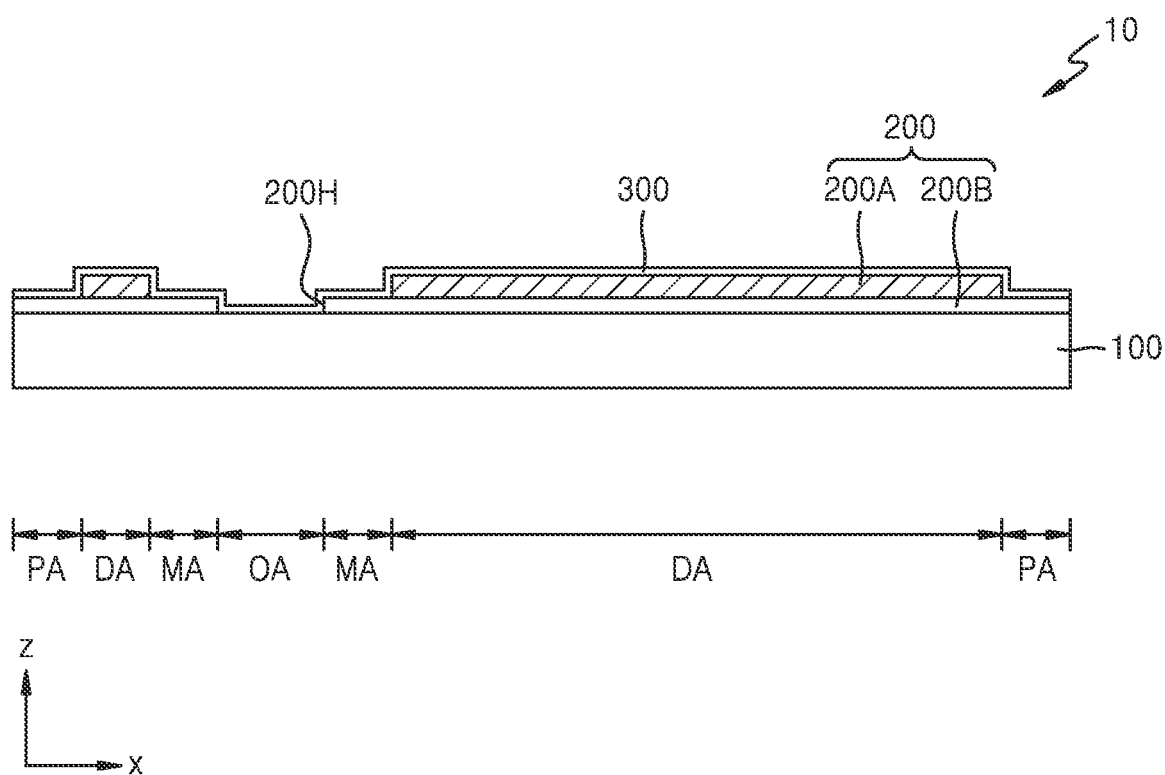

In some other embodiments, as shown in FIG. 4B, the substrate 100 may not include a through hole corresponding to the first area OA. The display layer 200 may include the through hole 200H corresponding to the first area OA. The thin-film encapsulation layer 300 may not include a through hole corresponding to the first area OA. In some other embodiments, as shown in FIG. 4C, the display layer 200 may not include the through hole 200H corresponding to the first area OA.

Figure 4C:
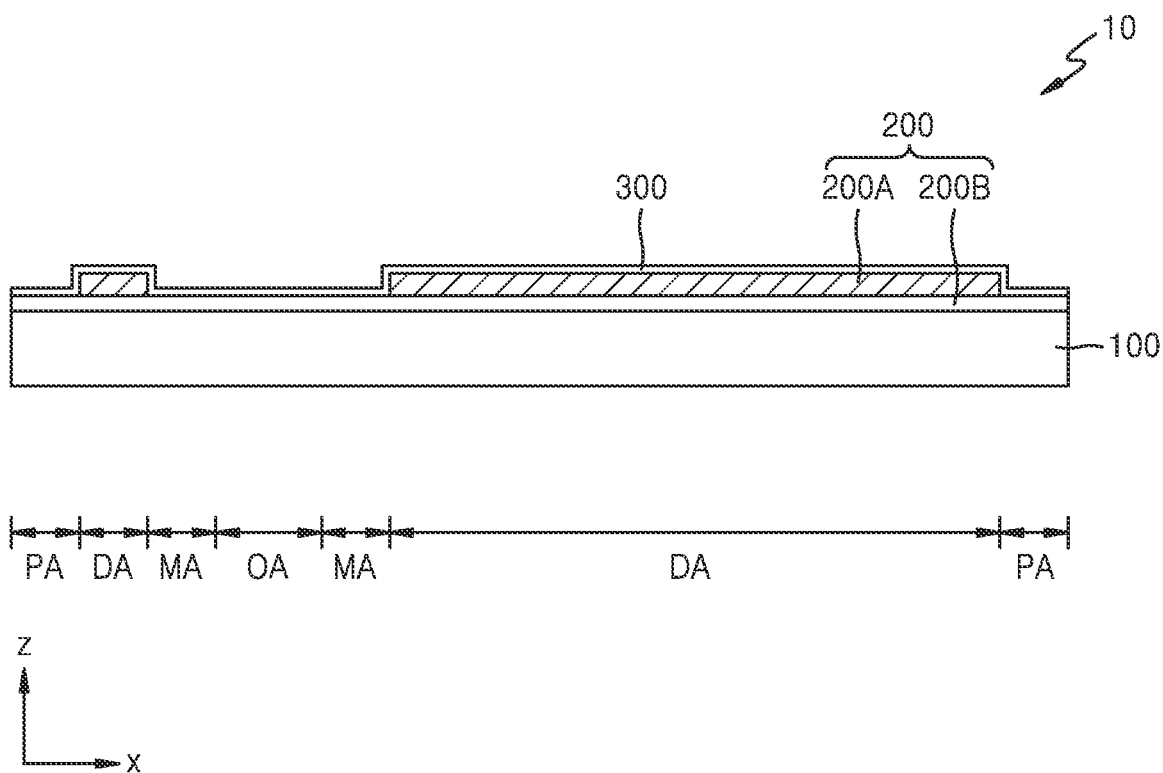
Figure 4D:
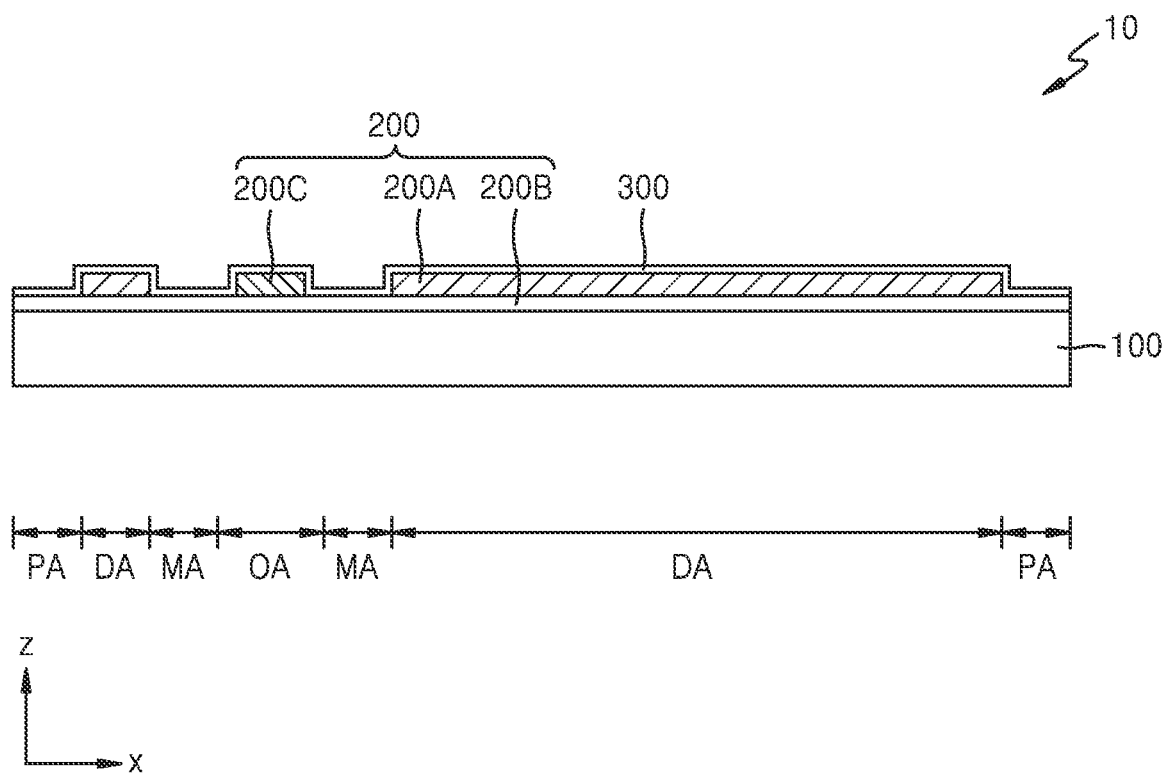

Though it is shown in FIGS. 4A-4C that the display element layer 200A is not located in the first area OA, the embodiments are not limited thereto. In some other embodiments, as shown in FIG. 4D, an auxiliary display element layer 200C may be located in the first area OA. The auxiliary display element layer 200C may include a display element that has a structure that is different from that of the display element of the display element layer 200A and/or operates in a way that is different from that of the display element of the display element layer 200A.

In an embodiment, each pixel of the display element layer 200A may include an active-type organic light-emitting diode, and the auxiliary display element layer 200C may include pixels each including a passive-type organic light-emitting diode. In the case where the auxiliary display element layer 200C includes a passive-type organic light-emitting diode as a display element, there is no element constituting a pixel circuit below the passive-type organic light-emitting diode. For example, a portion of the pixel circuit layer 200B under the auxiliary display element layer 200C does not include a transistor and a storage capacitor.

In some other embodiments, though the auxiliary display element layer 200C may include the same type of display element (e.g., an active-type organic light-emitting diode) as that of the display element layer 200A, a structure of a pixel circuit therebelow may be different. For example, a pixel circuit (e.g., a pixel circuit including a light-blocking layer between a substrate and a transistor) below the auxiliary display element layer 200C may have a structure different from that of a pixel circuit below the display element layer 200A. Alternatively, display elements of the auxiliary display element layer 200C may operate according to a control signal different from a control signal of the display elements of the display element layer 200A. A component (e.g., an infrared sensor) that does not require a relatively high transmittance may be located in the first area OA in which the auxiliary display element layer 200C is located. In this case, the first area OA may be a component area and an auxiliary display area.

Figure 5:
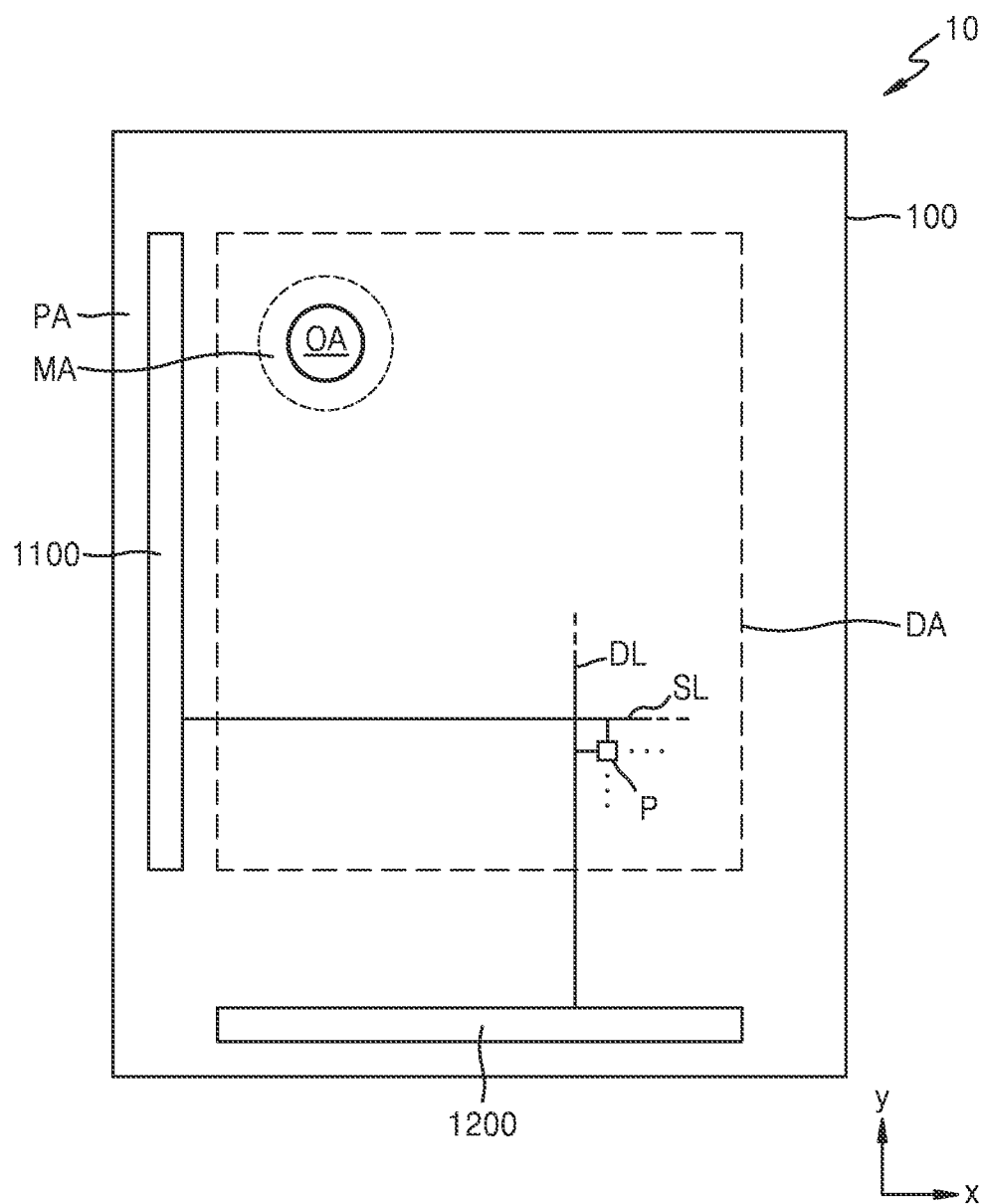
FIG. 5 is a plan view of a display panel according to some example embodiments.
Figure 6:
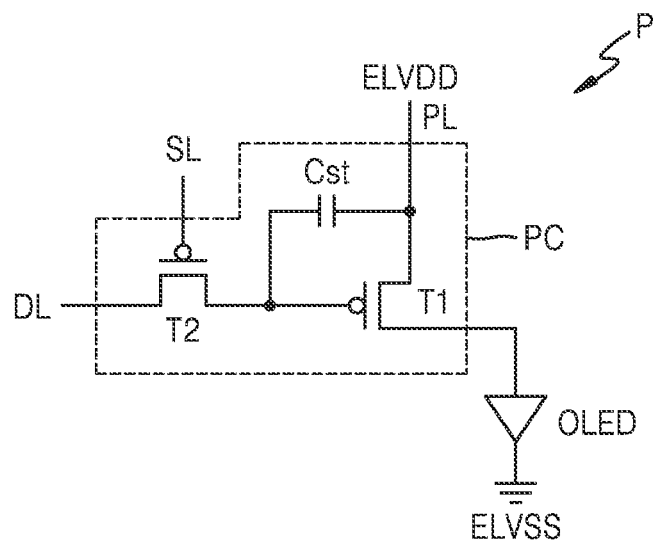
FIG. 6 is an equivalent circuit representation of one of the pixels in a display panel according to some example embodiments.

FIG. 5 is a plan view of a display panel 10 according to an embodiment, and FIG. 6 is an equivalent circuit representation of one of the pixels in a display panel according to an embodiment.

Referring to FIG. 5, the display panel 10 may include the first area OA, the display area DA, which is the second area, the middle area MA, which is the third area, and the peripheral area PA, which is the fourth area. FIG. 5 illustrates the substrate 100 of the display panel 10. For example, the substrate 100 may include the first area OA, the display area DA, the middle area MA, and the peripheral area PA.

The display panel 10 includes a plurality of pixels P placed in the display area DA. As shown in FIG. 6, each pixel P may include a pixel circuit PC and an organic light-emitting diode OLED as a display element, the display element being connected to the pixel circuit PC. The pixel circuit PC may include a first thin film transistor T1, a second thin film transistor T2, and a storage capacitor Cst. Each pixel P may emit, for example, red, green, blue, or white light from an organic light-emitting diode OLED.

The second thin film transistor T2 may include a switching thin film transistor, may be connected to a scan line SL and a data line DL, and may transfer a data voltage input to the data line DL to the first thin film transistor T1 based on a switching voltage input to the scan line SL. The storage capacitor Cst may be connected to the second thin film transistor T2 and a driving voltage line PL, and may store a voltage corresponding to a difference between a voltage transferred from the second thin film transistor T2 and a first power voltage ELVDD supplied through the driving voltage line PL.

The first thin film transistor T1 is a driving thin film transistor, may be connected to the driving voltage line PL and the storage capacitor Cst, and may control a driving current flowing through the organic light-emitting diode OLED from the driving voltage line PL in response to the voltage value (or charge) stored in the storage capacitor Cst. The organic light-emitting diode OLED may emit light having a set or predetermined brightness according to the driving current. An opposite electrode (e.g., a cathode) of the organic light-emitting diode OLED may receive a second power voltage ELVSS.

Though it is shown in FIG. 6 that the pixel circuit PC includes two thin film transistors and one storage capacitor, the present disclosure is not limited thereto. The number of thin film transistors and the number of storage capacitors may be variously modified depending on a design of the pixel circuit PC. For example, the pixel circuit PC may further include four or more thin film transistors in addition to the two thin film transistors.

Referring to FIG. 5 again, the middle area MA may surround the first area OA in a plan view. The middle area MA is an area in which a display element such as an organic light-emitting diode that emits light is not placed. Signal lines may pass across the middle area MA, the signal lines providing a signal to the pixels P located around the first area OA. A scan driver 1100, a data driver 1200, and a main power line (not shown) may be placed in the peripheral area PA, the scan driver 1100 providing a scan signal to each pixel P, the data driver 1200 providing a data signal to each pixel P, and the main power line providing a first power voltage and a second power voltage. Although it is shown in FIG. 5 that the data driver 1200 is adjacent to one side of the substrate 100, the data driver 1200 may be located on a flexible printed circuit board (FPCB) electrically connected to a pad located on one side of the display panel 10 in some other embodiments.

Figure 7:
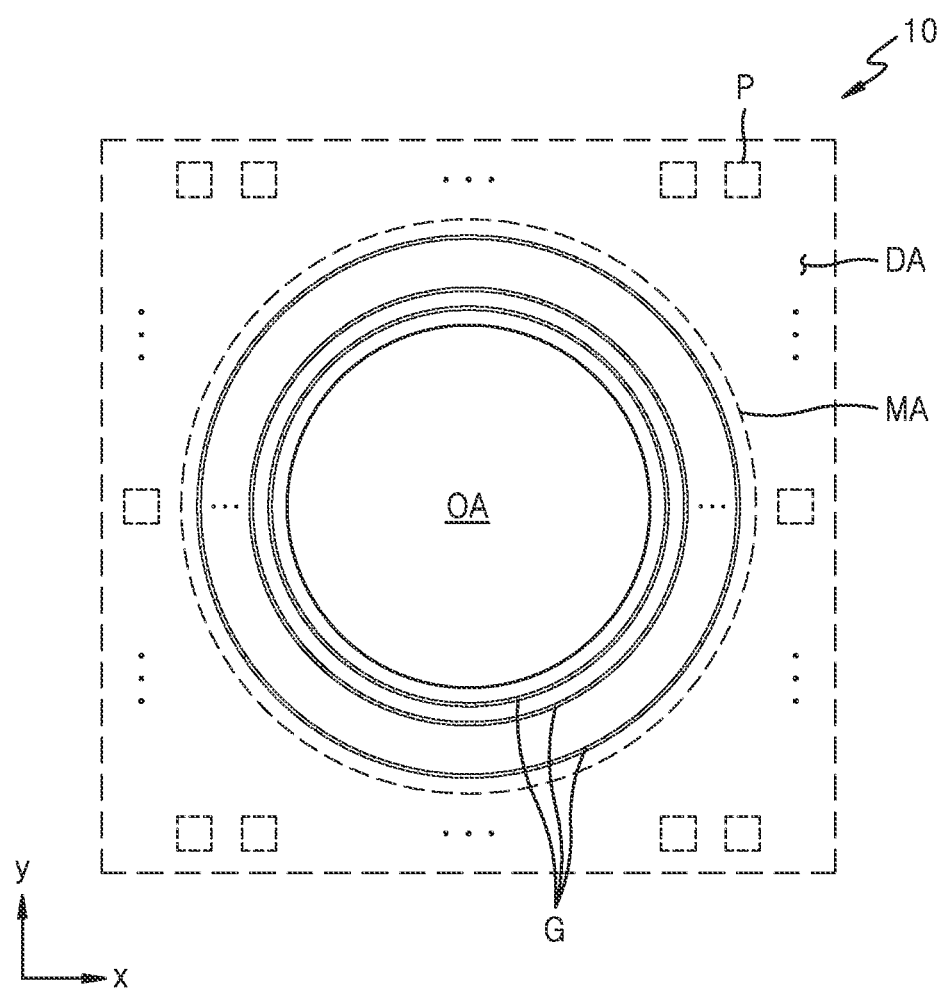
FIG. 7 is a plan view of a portion of a display panel according to some example embodiments.
Figure 8:
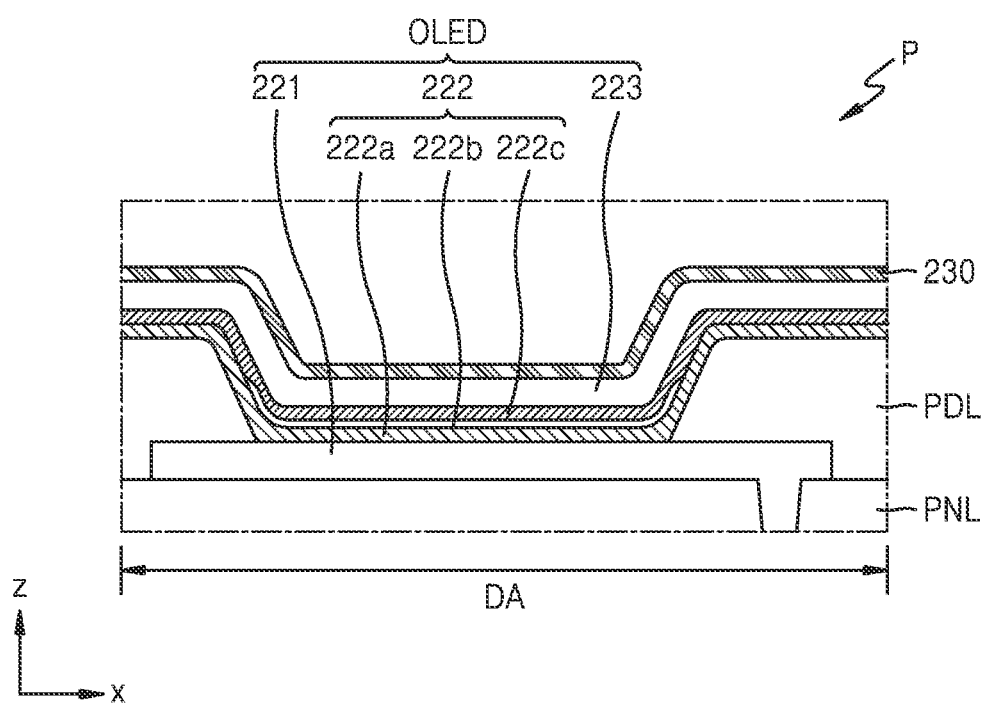
FIG. 8 is a cross-sectional view of an organic light-emitting diode of one of the pixels in a display panel according to some example embodiments.

FIG. 7 is a plan view of a portion of a display panel according to an embodiment, and FIG. 8 is a cross-sectional view of an organic light-emitting diode of one of the pixels in a display panel according to an embodiment. For convenience of description, in FIG. 8, a thin-film encapsulation layer, which is an encapsulation member, is omitted.

Referring to FIG. 7, pixels P are placed around the first area OA in the display area DA. The first area OA may be defined between (e.g., among) the pixels P. For example, pixels P may be vertically placed around the first area OA in a plan view, and pixels P may be horizontally placed around the first area OA in a plan view.

As shown in FIG. 8, each pixel P may include an organic light-emitting diode OLED. The organic light-emitting diode OLED may include a pixel electrode 221, an opposite electrode 223, and an intermediate layer 222, the opposite electrode 223 facing the pixel electrode 221, and the intermediate layer 222 being between the pixel electrode 221 and the opposite electrode 223.

The pixel electrode 221 is located on a planarization layer PNL. The pixel electrode 221 may include a conductive oxide such as indium tin oxide (ITO), indium zinc oxide (IZO), zinc oxide (ZnO), or indium oxide ($In_2O_3$), indium gallium oxide (IGO), or aluminum zinc oxide (AZO). In some other embodiments, the pixel electrode 221 may include a reflective layer including Ag, Mg, Al, Pt, Pd, Au, Ni, Nd, Ir, Cr, or a compound thereof. In some other embodiments, the pixel electrode 221 may further include a layer including ITO, IZO, ZnO, or $In_2O_3$ over/under the reflective layer.

A pixel-defining layer PDL may be on the pixel electrode 221. The pixel-defining layer PDL may include an opening that may expose a top surface of the pixel electrode 221 and cover edges of the pixel electrode 221. The pixel-defining layer PDL may include an organic insulating material. Alternatively, the pixel-defining layer PDL may include an organic insulating material and an inorganic insulating material.

The intermediate layer 222 includes an emission layer 222b. The intermediate layer 222 may include a first functional layer 222a under the emission layer 222b and/or a second functional layer 222c on the emission layer 222b. The emission layer 222b may include a polymer or low molecular weight organic material that emits light of a set or predetermined color.

The first functional layer 222a may include a single layer or a multi-layer. For example, in the case where the first functional layer 222a includes a polymer material, the first functional layer 222a may be a hole transport layer (HTL), which has a single-layered structure. The first functional layer 222a may include poly-(3, 4)-ethylene-dihydroxy thiophene (PEDOT) or polyaniline (PANI). In the case where the first functional layer 222a includes a low molecular weight material, the first functional layer 222a may include a hole injection layer (HIL) and a hole transport layer (HTL).

In some embodiments, the second functional layer 222c may be optional. For example, in the case where the first functional layer 222a and the emission layer 222b include a polymer material the second functional layer 222c may be formed. The second functional layer 222c may include a single layer or a multi-layer. The second functional layer 222c may include an electron transport layer (ETL) and/or an electron injection layer (EIL).

The emission layer 222b of the intermediate layer 222 may be placed for each pixel. For example, the emission layer 222b may be patterned to correspond to the pixel electrode 221. Unlike the emission layer 222b, each of the first functional layer 222a and/or the second functional layer 222c of the intermediate layer 222 may be formed as one body so as to correspond to a plurality of pixels An opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or $In_2O_3$ on the (semi) transparent layer including the above material. The opposite electrode 223 may be located in not only the display area DA but also the middle area MA. The first functional layer 222a, the second functional layer 222c, and the opposite electrode 223 may be formed by thermal deposition.

A capping layer 230 may be located on the opposite electrode 223. For example, the capping layer 230 may include LiF and be formed by thermal deposition. In an embodiment, the capping layer 230 may be omitted.

A layer(s) including an organic material among layers provided to the display panel may provide a path through which moisture may propagate. The first functional layer 222a and/or the second functional layer 222c included in the stacked structure of the organic light-emitting diode OLED include an organic material and thus may provide a path through which moisture may propagate. However, because the first functional layer 222a and/or the second functional layer 222c are disconnected or separated by grooves G (as shown in FIG. 7) provided in the middle area MA, the above-described moisture transmission issue and damage to the organic light-emitting diode OLED may be prevented or reduced.

As shown in FIG. 7, one or more grooves G may be located in the middle area MA. As shown in FIG. 7, in a plan view, grooves G may have a ring shape surrounding the first area OA and be apart from each other.

A groove G may be located in a multi-layer including a plurality of layers, and the groove G that is concave in a depth direction of the multi-layer may have an undercut structure. The multi-layer and a structure of the groove G are described below with reference to FIGS. 9A-9F.

FIGS. 9A-9F are the cross-sectional views of one of the grooves in a display panel according to an embodiment. For convenience of description, FIGS. 9A-9F omit a thin-film encapsulation layer, which is an encapsulation member.

Referring to FIGS. 9A-9F, a multi-layer ML includes an upper layer UL, a lower layer LL. The lower layer LL and/or the upper layer UL including a plurality of sub-layers.

Figure 9A:
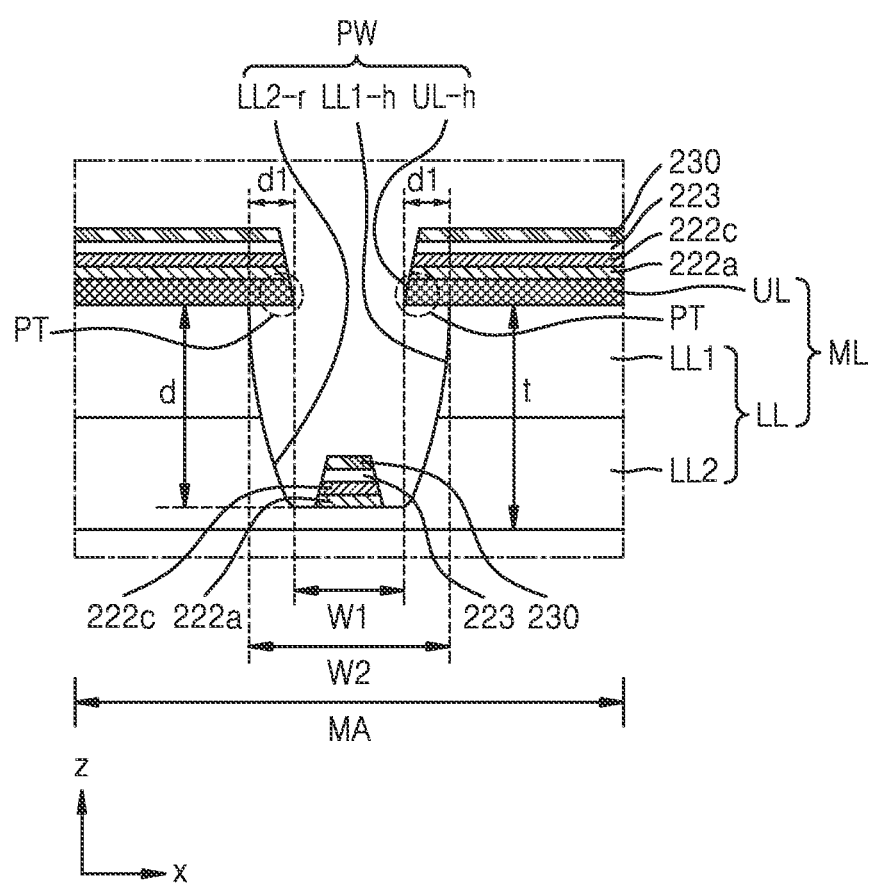
FIGS. 9A-9F are cross-sectional views of one of the grooves in a display panel according to some example embodiments.
Figure 9B:
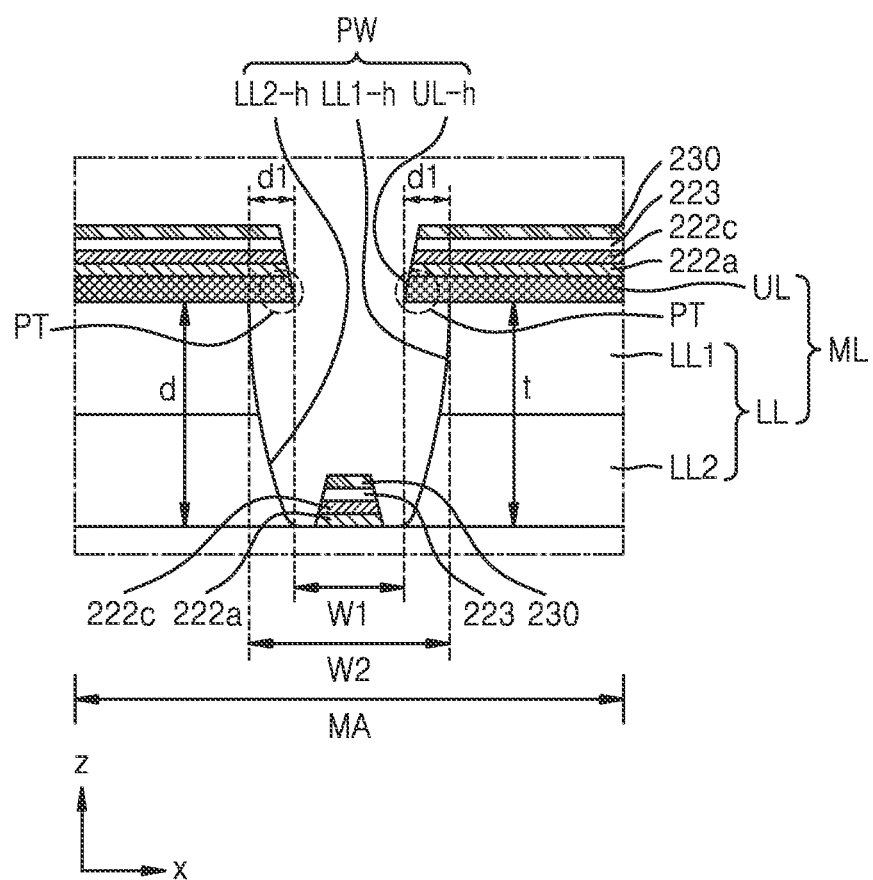

Referring to FIGS. 9A and 9B, the multi-layer ML includes the lower layer LL and the upper layer UL. The lower layer LL may include a first sub-lower layer LL1 and a second sub-lower layer LL2 under the first sub-lower layer LL1. The upper layer UL may include a single layer.

The lower layer LL and the upper layer UL may include different materials. For example, the first sub-lower layer LL1 and the second sub-lower layer LL2 may include an organic material, for example, an organic insulating material. The upper layer UL may include an inorganic material.

The organic insulating material of the lower layer LL may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The inorganic material of the upper layer UL may include a material different from an organic material containing carbon element, the material including a conductive oxide such as IZO, ITO, ZnO, $In_2O_3$, IGO, and/or AZO. Alternatively, the inorganic material of the upper layer UL may include a metal such as Mo, Al, Cu, and/or Ti. Alternatively, the inorganic material of the upper layer UL may include an insulating material such as silicon nitride, silicon oxide, and/or silicon oxynitride.

The groove G may be located in a depth direction of the multi-layer ML. The groove G may include a top-hole UL-h passing through the upper layer UL, and a bottom-hole or a bottom-recess located in the lower layer LL. In an embodiment, as shown in FIG. 9A, the groove G may include a top-hole UL-h of the upper layer UL, a first bottom-hole LL1-h of the first sub-lower layer LL1, and a second recess LL2-r of the second sub-lower layer LL2. Alternatively, as shown in FIG. 9B, the groove G may include a top-hole UL-h of the upper layer UL, a first bottom-hole LL1-h of the first sub-lower layer LL1, and a second bottom-hole LL2-h of the second sub-lower layer LL2. A depth d of the groove G may be less than a thickness t of the lower layer LL, and a bottom surface of the groove G may be located between a top surface and a bottom surface of the second sub-lower layer LL2 (see FIG. 9A). Alternatively, a depth d of the groove G may be equal to the thickness t of the lower layer LL, and the bottom surface of the groove G may be located on the same surface as a bottom surface of the second sub-lower layer LL2 (see FIG. 9B).

The groove G may have an undercut structure. Referring to FIGS. 9A and 9B, a first width W1 of the top-hole UL-h may be less than a width of the lower layer LL, for example, a second width W2 of the first bottom-hole LL1-h of the first sub-lower layer LL1. Ends of the upper layer UL that protrude toward the groove G, for example, a center of the groove G may constitute a pair of tips PT. A protruding length dl of each tip PT may be less than a depth d of the groove G. The protruding length dl of the tip PT may be less than 2 µm. For example, the protruding length dl of the tip PT may be about 1 µm to about 1.5 µm. The depth d of the groove G may be 2 µm or more, 2.5 µm or more, 3 µm or more, or 3.5 µm or more.

An organic material layer(s) included in the stacked structure of the organic light-emitting diode OLED (see FIG. 8) described with reference to FIGS. 7 and 8 may be disconnected or separated by the groove G. For example, as shown in FIGS. 9A and 9B, the first functional layer 222a and the second functional layer 222c may be disconnected or separated around the groove G. Likewise, the opposite electrode 223 and the capping layer 230 may be disconnected or separated around the groove G. Though it is shown in FIGS. 9A, 9B and FIGS. 9C-19 discussed below that the first functional layer 222a, the second functional layer 222c, the opposite electrode 223, and the capping layer 230 are disconnected or separated around the groove G, the embodiments are not limited thereto. As described above, the second functional layer 222c and/or the capping layer 230 may be omitted. In this case, there is no second functional layer 222c and/or capping layer 230 around the groove G.

As described with reference to FIGS. 9A and 9B, the first functional layer 222a, the second functional layer 222c, the opposite electrode 223, and the capping layer 230 may be disconnected or separated by the groove G, and the multi-layer ML in which the groove G is located may have not only the structure shown in FIGS. 9A and 9B but also various structures described below with reference to FIGS. 9C-9F.

Figure 9C:
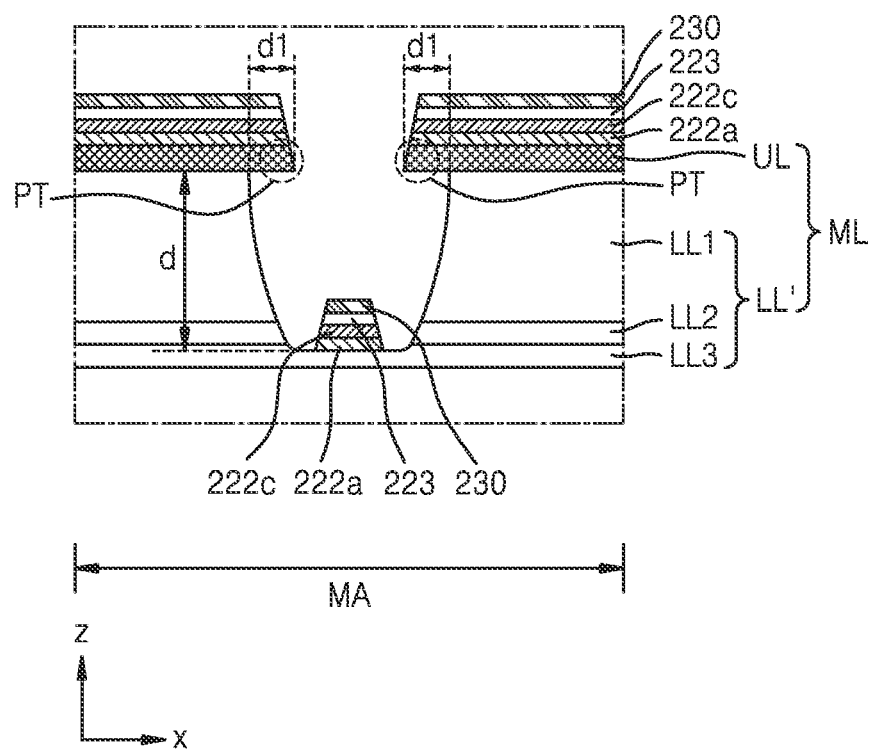

Referring to FIG. 9C, the groove G is located in the multi-layer ML. A lower layer LL' of the multi-layer ML may include a first sub-lower layer LL1, a second sub-lower layer LL2 under the first sub-lower layer LL1, and a third sub-lower layer LL3 under the second sub-lower layer LL2.

Two or three of the first sub-lower layer LL1, the second sub-lower layer LL2, and the third sub-lower layer LL3 may include different materials. For example, the first sub-lower layer LL1 may include an organic insulating material, and the second sub-lower layer LL2 and the third sub-lower layer LL3 may include an inorganic insulating material such as silicon nitride, silicon oxide, and silicon oxynitride.

Though it is shown in FIG. 9C that the lower layer LL' includes two inorganic insulating material layers, for example, the second sub-lower layer LL2 and the third sub-lower layer LL3, the embodiments are not limited thereto. In some other embodiments, the lower layer LL' includes the first sub-lower layer LL1 and one or three or more sub-layer(s) placed under the first sub-lower layer LL1 and including an inorganic insulating material.

As described with reference to FIG. 9A, the upper layer UL may include a single layer or a multi-layer and includes an inorganic material. The upper layer UL may include an inorganic insulating material such as silicon nitride, silicon oxide, or silicon oxynitride. Alternatively, the upper layer UL may include a conductive oxide such as IZO or may include a metal such as Mo, Ti, and Cu.

The groove G may have an undercut shape. A protruding length dl of a pair of tips PT that protrude toward a center of the groove G, a depth d of the groove G, and a characteristic in which the first functional layer 222a, the second functional layer 222c, the opposite electrode 223, and the capping layer 230 are disconnected around the groove G are the same as those described with reference to FIGS. 9A and 9B. Though it is shown in FIG. 9C that a bottom surface of the groove G is located between a top surface and a bottom surface of the third sub-lower layer LL3, the bottom surface of the groove G may be located on the same surface as the bottom surface of the third sub-lower layer LL3 in some other embodiments.

Figure 9D:
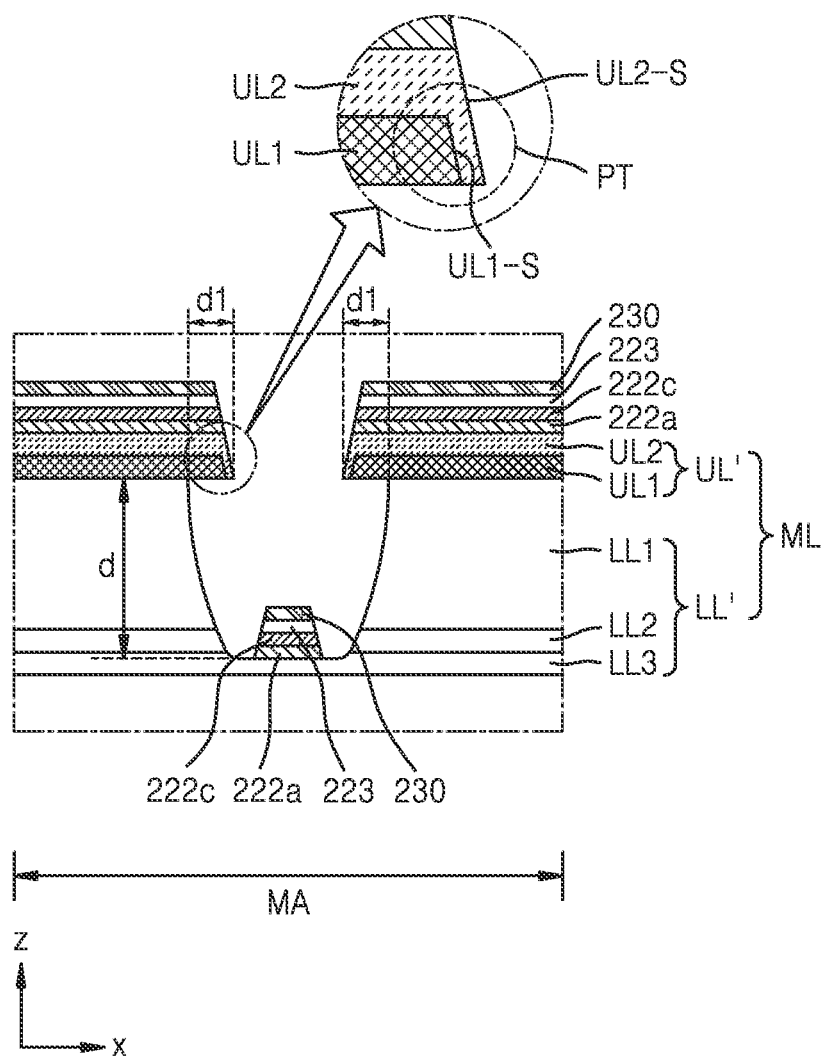

Referring to FIG. 9D, the groove G is located in the multi-layer ML, and as described with reference to FIG. 9C, the lower layer LL' of the multi-layer ML may include the first sub-lower layer LL1, the second sub-lower layer LL2, and the third sub-lower layer LL3. In some other embodiments, the lower layer LL' of FIG. 9D may have the structure of the lower layer LL described with reference to FIGS. 9A and 9B.

A upper layer UL' of the multi-layer ML may include a first sub-upper layer UL1 and a second sub-upper layer UL2 on the first sub-upper layer UL1. The upper layer UL may include an inorganic material, and the first sub-upper layer UL1 and the second sub-upper layer UL2 may have different materials. For example, the first sub-upper layer UL1 may include a conductive oxide such as IZO or may include a metal such as Al, Mo, and Ti. The second sub-upper layer UL2 may include an insulating material such as silicon nitride, silicon oxide, and silicon oxynitride.

A lateral surface UL1-S of the first sub-upper layer UL1 that faces the groove G may be covered by the second sub-upper layer UL2. The lateral surface UL1-S of the first sub-upper layer UL1 may be alongside a lateral surface UL2-S of the second sub-upper layer UL2. In an embodiment, in the case where the first sub-upper layer UL1 includes three layers of titanium, aluminum, and titanium, aluminum is damaged more than titanium during a process of manufacturing the display panel and thus unevenness may be formed in the lateral surface UL1-S of the first sub-upper layer UL1. In contrast, according to an embodiment, because the lateral surface UL1-S of the first sub-upper layer UL1 is covered by the second sub-upper layer UL2, the lateral surface UL1-S of the first sub-upper layer UL1 may be saved or prevented from being damaged.

The first sub-upper layer UL1 and the second sub-upper layer UL2 may extend further to the center of the groove G than a lateral surface of the lower layer LL, thereby defining a pair of tips PT. A protruding length dl of each tip PT and the depth d of the groove G are the same as those described above.

Though it is shown in FIG. 9D that the bottom surface of the groove G is between a top surface and a bottom surface of the third sub-lower layer LL3, the embodiments are not limited thereto. In some other embodiments, similar to that described with reference to FIG. 9B, the bottom surface of the groove G may be located on the same surface as the bottom surface of the third sub-lower layer LL3.

Figure 9E:
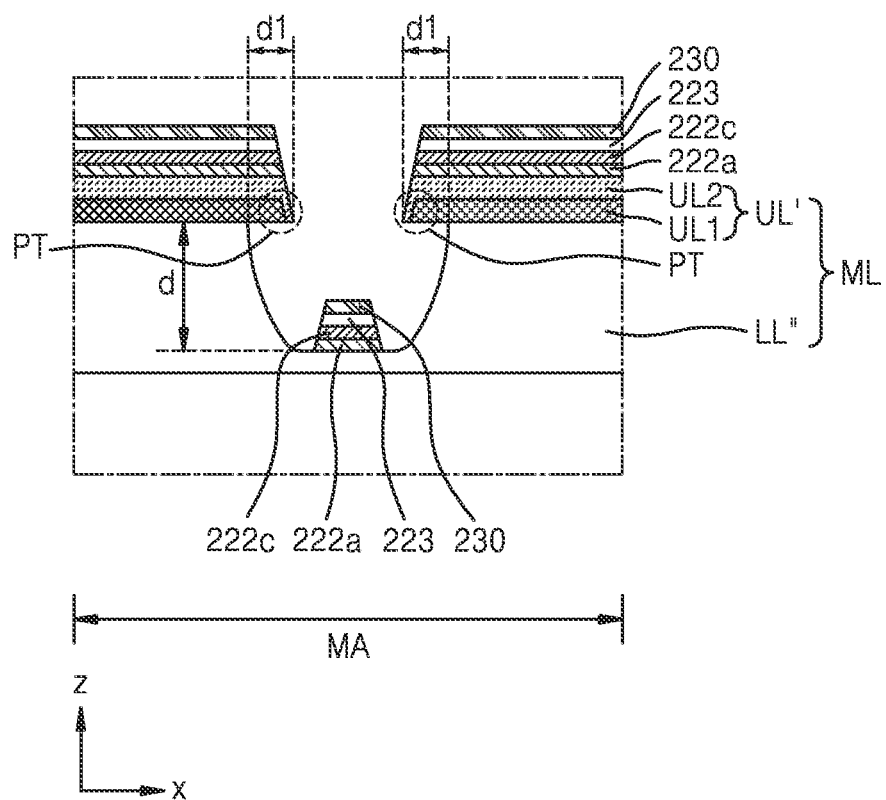

Referring to FIG. 9E, the upper layer UL' of the multi-layer ML is the same as that described with reference to FIG. 9D and the multi-layer ML of FIG. 9E is different from the multi-layer ML of FIG. 9D in that a lower layer LL" is a single layer. The lower layer LL" may include an organic insulating material. A depth d of the groove G may be equal to or less than a thickness of the lower layer LL".

Though it is shown in FIG. 9E that the bottom surface of the groove G is between a top surface and a bottom surface of the lower layer LL", the bottom surface of the groove G may be located on the same surface as the bottom surface of the lower layer LL" in some other embodiments.

Figure 9F:
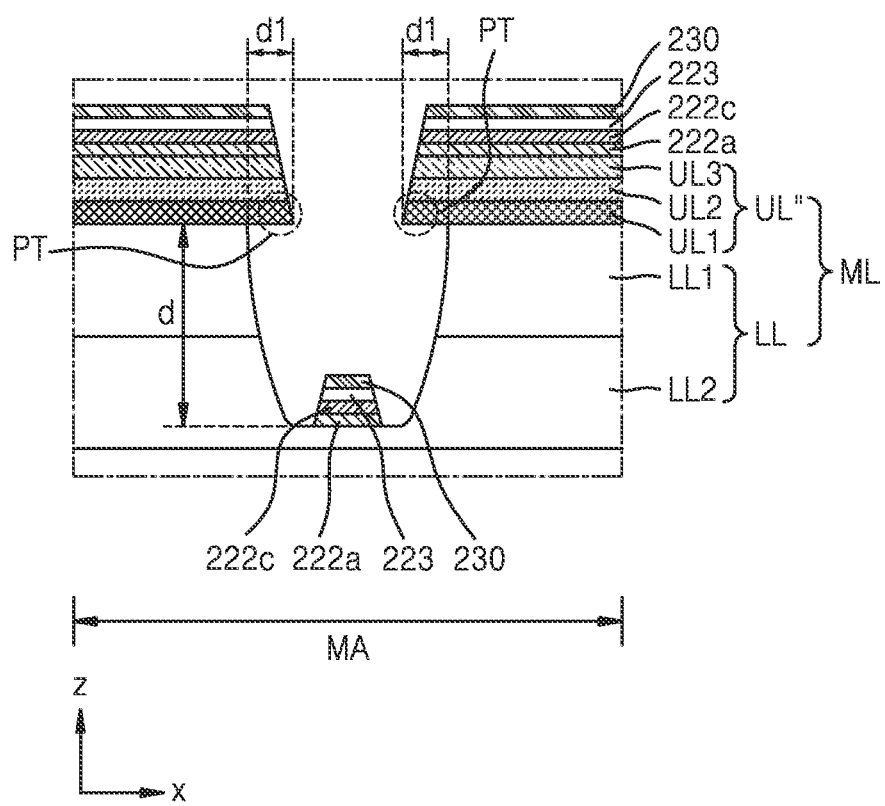

Referring to FIG. 9F, the lower layer LL of the multi-layer ML may include the first sub-lower layer LL1 and the second sub-lower layer LL2 as shown above in FIGS. 9A and 9B. In some other embodiments, the lower layer LL may include the bottom layers LL' and LL" as described with reference to FIGS. 9C-9E.

A upper layer UL" of the multi-layer ML may include a plurality of layers. For example, the upper layer UL" may include a first sub-upper layer UL1, a second sub-upper layer UL2 on the first sub-upper layer UL1, and a third sub-upper layer UL3 on the second sub-upper layer UL2. Two or more of the first sub-upper layer UL1, the second sub-upper layer UL2, and the third sub-upper layer UL3 may include different materials.

For example, the first sub-upper layer UL1 and the third sub-upper layer UL3 may include a conductive oxide such as IZO or a metal, and the second sub-upper layer UL2 may include an insulating material such as silicon nitride. Alternatively, the first sub-upper layer UL1 and the third sub-upper layer UL3 may include an insulating material such as silicon nitride, and the second sub-upper layer UL2 may include a conductive oxide such as IZO or a metal.

Though it is shown in FIG. 9F that the upper layer UL" includes three sub-layers, the embodiments are not limited thereto. The upper layer UL" may include two sub-layers including the first sub-upper layer UL1 and the second sub-upper layer UL2. Alternatively, the upper layer UL" may include four or more sub-layers.

The first sub-upper layer UL1, the second sub-upper layer UL2, and the third sub-upper layer UL3 extend further toward the center of the groove G than a lateral side of the lower layer LL, thereby defining a pair of tips PT. A protruding length dl of each tip PT and the depth d of the groove G are the same as those described above.

Though it is shown in FIG. 9F that the bottom surface of the groove G is between a top surface and a bottom surface of the second sub-lower layer LL2, the embodiments are not limited thereto. In some other embodiments, as described with reference to FIG. 9B, the bottom surface of the groove G may be located on the same surface as the bottom surface of the second sub-lower layer LL2.

Figure 10:
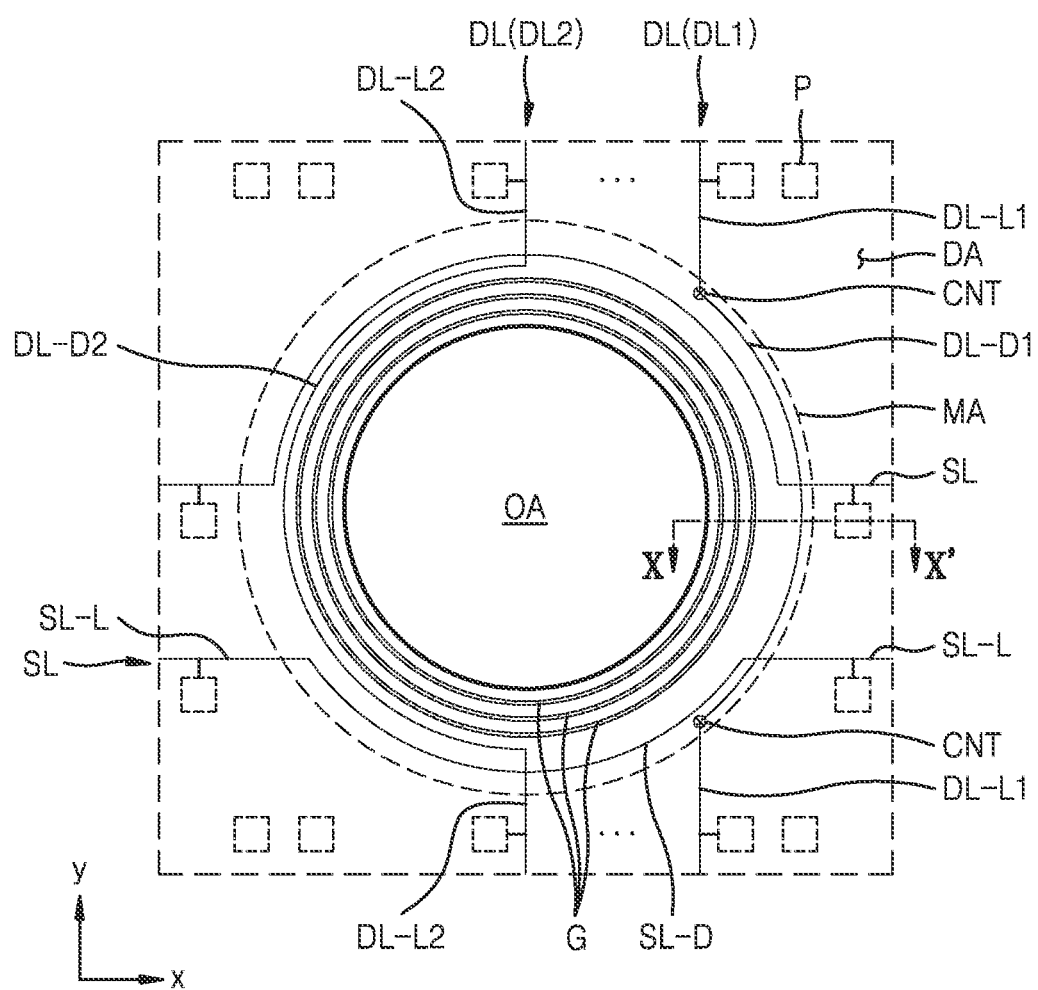
FIG. 10 is a plan view of a portion of a display panel according to some example embodiments.

FIG. 10 is a plan view of a portion of a display panel according to an embodiment.

Referring to FIG. 10, the middle area MA is between the first area OA and the display area DA, and a plurality of grooves G are located in the middle area MA. Though FIG. 10 shows three grooves G, the number of grooves G may be four or more.

Lines may bypass around an edge of the first area OA in the middle area MA. Signal lines connected to pixels P apart from each other around the first area OA may extend along the edge of the first area OA in the middle area MA.

In a plan view of FIG. 10, at least one data line DL passing across the display area DA may extend in a y-direction so as to provide a data signal to pixels P vertically placed around the first area OA and extend along the edge of the first area OA in the middle area MA. Similarly, at least one of scan lines SL passing across the display area DA may extend in an x-direction so as to provide a scan signal to pixels P horizontally placed around the first area OA and extend along the edge of the first area OA in the middle area MA.

A bypass portion (or a circuitous portion) SL-D of the scan line SL may be located on the same layer on which an extension portion SL-L crossing (e.g., intersecting) the display area DA is placed and may be formed as one body. A bypass portion DL-D1 of at least one (referred to as a first data line DL1, hereinafter) of data lines DL may be located on a layer different from a layer on which an extension portion DL-L1 crossing the display area DA is located, and the bypass portion DL-D1 of the data line DL may be connected to the extension portion DL-L1 through a contact hole CNT. A bypass portion DL-D2 of at least one (referred to as a second data line DL2, hereinafter) of the data lines DL may be located on the same layer on which an extension portion DL-L2 is located and may be formed as one body.

Figure 11:
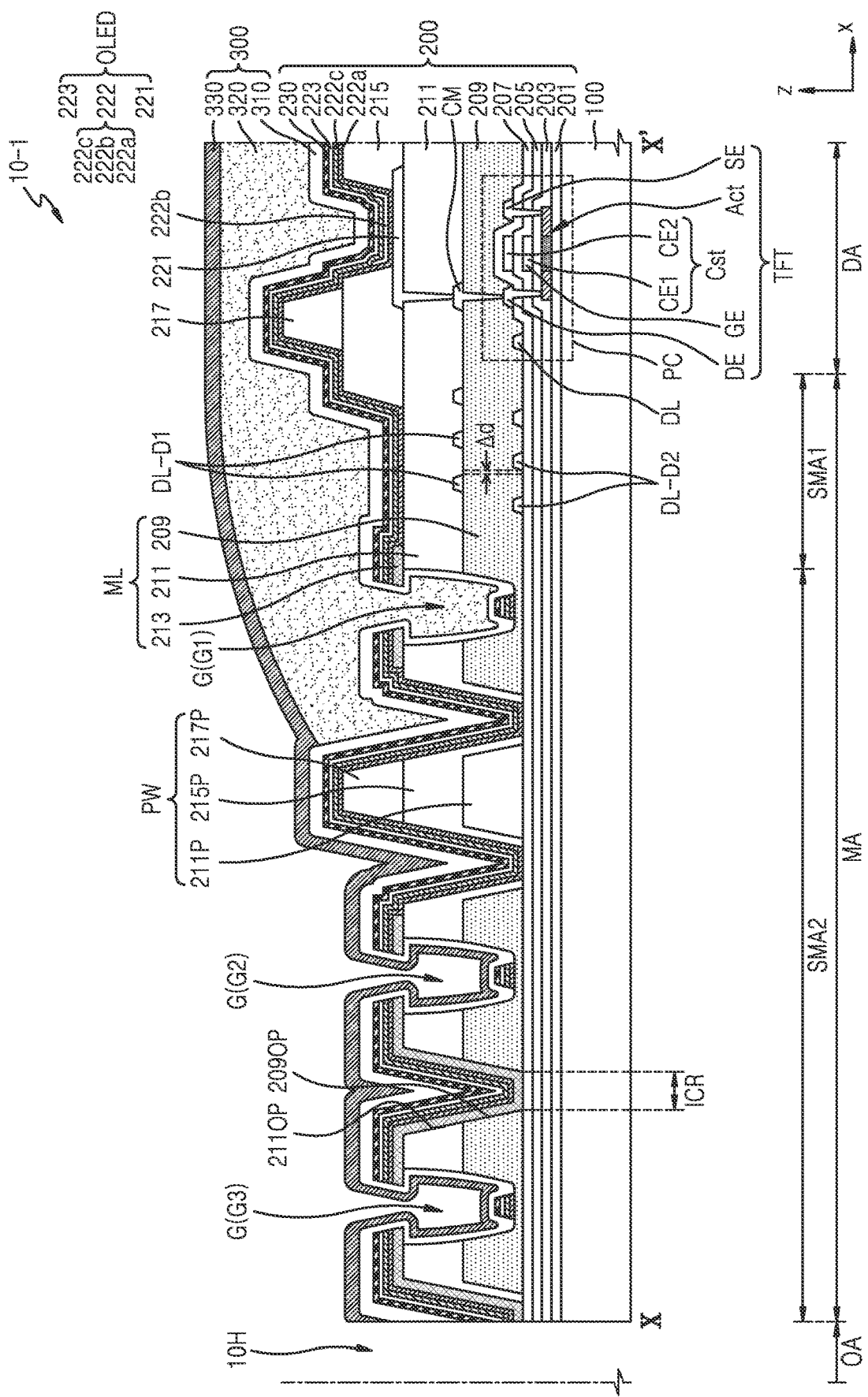
FIG. 11 is a cross-sectional view of a display panel according to some example embodiments.
Figure 12A:
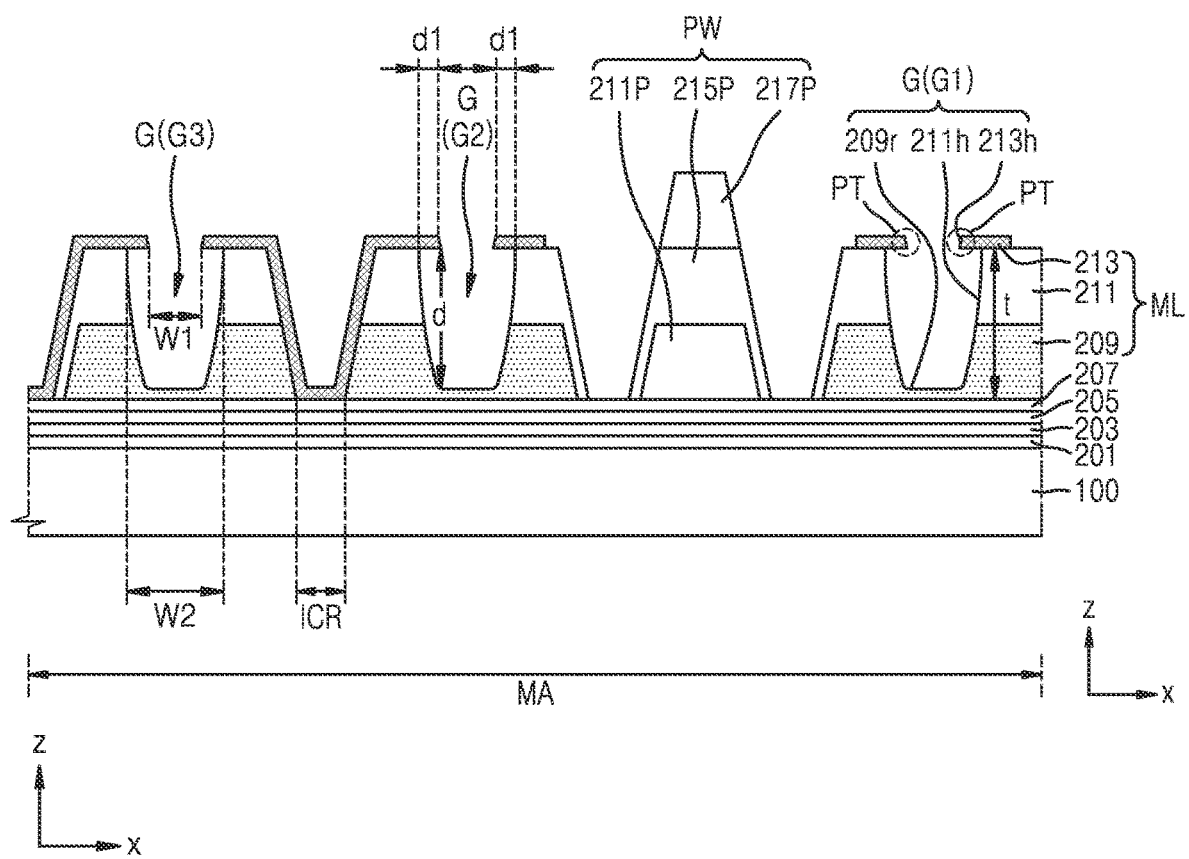
FIGS. 12A-12C are cross-sectional views of a process of manufacturing a display panel according to some example embodiments.
Figure 12B:
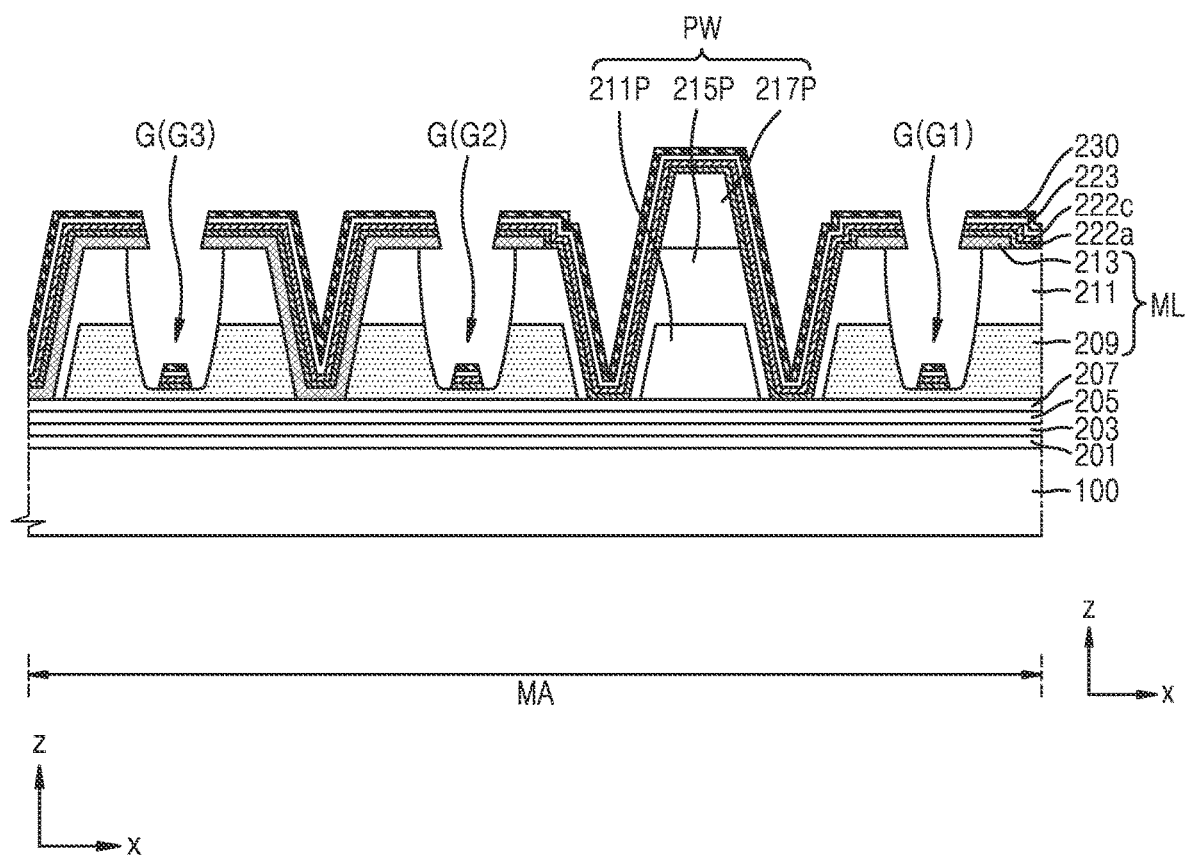
Figure 12C:
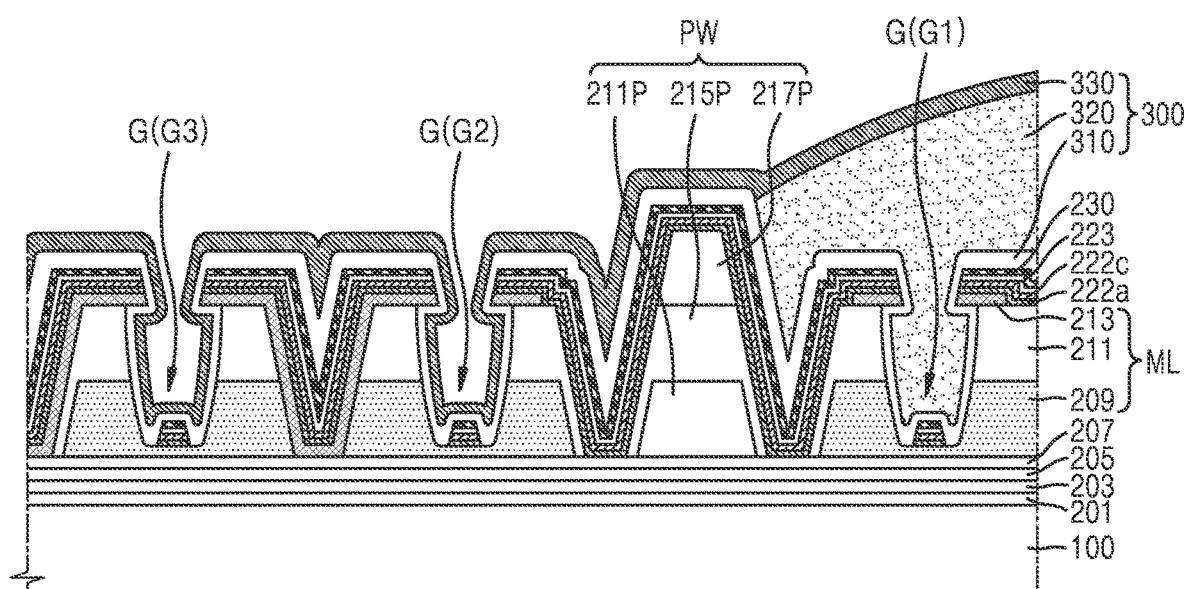
Figure 13:
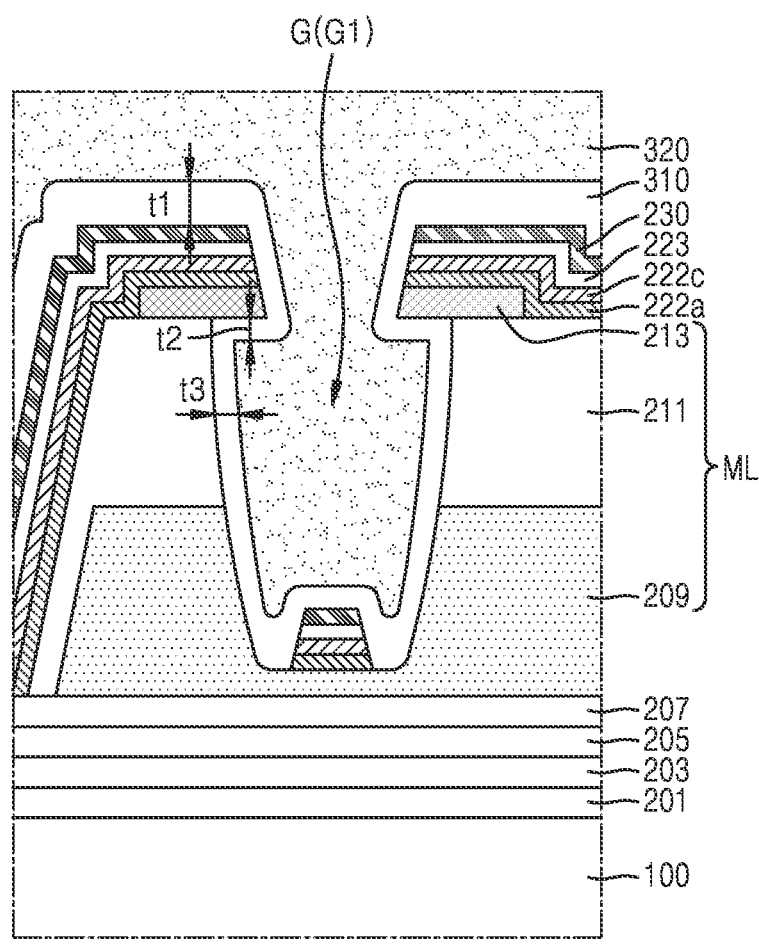
FIG. 13 is a cross-sectional view of one of the groove areas.

FIG. 11 is a cross-sectional view of a display panel according to an embodiment, FIGS. 12A-12C are cross-sectional views of a process of manufacturing a display panel according to some example embodiments and show a middle area, and FIG. 13 is a cross-sectional view of one of the groove areas. FIG. 11 may correspond to a cross-section taken along the line X-X' of FIG. 10.

Referring to FIG. 11, the middle area MA is between the first area OA and the display area DA, and a pixel circuit PC and an organic light-emitting diode OLED that correspond to each pixel P (see FIG. 10) are located in the display area DA.

First, referring to the display area DA of FIG. 11, the substrate 100 may include a glass material or a polymer resin. In an embodiment, as shown in an enlarged view of FIG. 4A, the substrate 100 may include a plurality of sub-layers.

A buffer layer 201 may be on the substrate 100. The buffer layer 201 may reduce or prevent impurities from penetrating into a semiconductor layer Act of a thin film transistor TFT. The buffer layer 201 may include an inorganic insulating material such as silicon nitride, silicon oxide, and silicon oxynitride and may also include a single layer or a multi-layer including the above mentioned inorganic insulating materials.

A pixel circuit PC may be on the buffer layer 201. The pixel circuit PC includes a thin film transistor TFT and a storage capacitor Cst. The thin film transistor TFT may include the semiconductor layer Act, a gate electrode GE, a source electrode SE, and a drain electrode DE. A data line DL of the pixel circuit PC may be electrically connected to a switching thin film transistor (not shown) included in the pixel circuit PC. Though the present embodiment shows a top gate-type thin film transistor TFT in which a gate electrode GE is placed over a semiconductor layer Act with a gate insulating layer 203 therebetween, the thin film transistor TFT may be a bottom gate-type thin film transistor TFT in an embodiment.

The semiconductor layer Act may include polycrystalline silicon. Alternatively, the semiconductor layer Act may include amorphous silicon, an oxide semiconductor, or an organic semiconductor. The gate electrode GE may include a low-resistance metal material. The gate electrode GE may include a conductive material including Mo, Al, Cu, and Ti, and may include a single layer or a multi-layer including the above materials.

The gate insulating layer 203 between the semiconductor layer Act and the gate electrode GE may include an inorganic insulating material such as silicon nitride, silicon oxide, silicon oxynitride, aluminum oxide, titanium oxide, tantalum oxide, and hafnium oxide. The gate insulating layer 203 may include a single layer or a multi-layer including the above materials.

The source electrode SE and the drain electrode DE may be located on the same layer on which the data line DL is placed, and may include the same material as that of the data line DL. The source electrode SE, the drain electrode DE, and the data line DL may include a material having a relatively high (e.g., an excellent) conductivity. The source electrode SE and the drain electrode DE may include a conductive material including Mo, Al, Cu, and Ti, and may include a single layer or a multi-layer including the above materials. In an embodiment, the source electrode SE, the drain electrode DE, and the data line DL may each include a multi-layer of Ti/Al/Ti.

The storage capacitor Cst may include a bottom electrode CE1 and a top electrode CE2, the bottom electrode CE1 overlapping the top electrode CE2 with a first interlayer insulating layer 205 therebetween. The storage capacitor Cst may overlap the thin film transistor TFT. With regard to this, it is shown in FIG. 11 that the gate electrode GE of the thin film transistor TFT serves as the bottom electrode CE1 of the storage capacitor Cst. In some other embodiments, the storage capacitor Cst may not overlap the thin film transistor TFT. The storage capacitor Cst may be covered by a second interlayer insulating layer 207. The top electrode CE2 of the storage capacitor Cst may include a conductive material including Mo, Al, Cu, and Ti, and may include a single layer or a multi-layer including the above materials.

The first interlayer insulating layer 205 and the second interlayer insulating layer 207 may include an inorganic insulating material such as silicon nitride, silicon oxide, silicon oxynitride, aluminum oxide, titanium oxide, tantalum oxide, and hafnium oxide. The first interlayer insulating layer 205 and the second interlayer insulating layer 207 may include a single layer or a multi-layer including the above materials.

The pixel circuit PC including the thin film transistor TFT and the storage capacitor Cst may be covered by a first organic insulating layer 209. The first organic insulating layer 209 may include an approximately flat top surface.

The pixel circuit PC may be electrically connected to the pixel electrode 221. For example, as shown in FIG. 11, a contact metal layer CM may be placed between the thin film transistor TFT and the pixel electrode 221. The contact metal layer CM may be connected to the thin film transistor TFT through a contact hole in the first organic insulating layer 209, and the pixel electrode 221 may be connected to the contact metal layer CM through a contact hole in a second organic insulating layer 211 on the contact metal layer CM. The contact metal layer CM may include a conductive material including Mo, Al, Cu, and Ti, and may include a single layer or a multi-layer including the above materials. In an embodiment, the contact metal layer CM may include three layers of Ti/Al/Ti.

The first organic insulating layer 209 and the second organic insulating layer 211 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. In an embodiment, the first organic insulating layer 209 and the second organic insulating layer 211 may include polyimide.

The pixel electrode 221 may be located on the second organic insulating layer 211. The second organic insulating layer 211 may be the planarization layer described above with reference to FIG. 8. Edges of the pixel electrode 221 may be covered by a pixel-defining layer 215. The pixel-defining layer 215 may include an opening that overlaps a central portion of the pixel electrode 221. A spacer 217 may be located on the pixel-defining layer 215. The spacer 217 may include a material different from that of the pixel-defining layer 215 or may include the same material as that of the pixel-defining layer 215. In an embodiment, the pixel-defining layer 215 and the spacer 217 may include the same material and may be concurrently formed during a mask process that uses a halftone mask. In an embodiment, the pixel-defining layer 215 and the spacer 217 may include polyimide.

The intermediate layer 222 includes the emission layer 222b. The intermediate layer 222 may include the first functional layer 222a and/or the second functional layer 222c, the first functional layer 222a being under the emission layer 222b, and the second functional layer 222c being on the emission layer 222b. The emission layer 222b may include a polymer or low molecular weight organic material that emits light having a set or predetermined color. The opposite electrode 223 may be located on the intermediate layer 222, and the capping layer 230 may be located on the opposite electrode 223. The capping layer 230 may be omitted.

Materials, structures, and characteristics of the pixel electrode 221, the intermediate layer 222, and the opposite electrode 223 are the same as those described with reference to FIG. 8.

The organic light-emitting diode OLED is covered by the thin-film encapsulation layer 300. The thin-film encapsulation layer 300 may include at least one organic encapsulation layer and at least one inorganic encapsulation layer. It is shown in FIG. 11 that the thin-film encapsulation layer 300 includes a first and a second inorganic encapsulation layers 310 and 330, and an organic encapsulation layer 320 therebetween. In some other embodiments, the number of organic encapsulation layers, the number of inorganic encapsulation layers, and a stacking sequence may be modified.

The first and second inorganic encapsulation layers 310 and 330 may include one or more inorganic materials selected from aluminum oxide, titanium oxide, tantalum oxide, hafnium oxide, zinc oxide, silicon nitride, silicon oxide, and silicon oxynitride. The first and second inorganic encapsulation layers 310 and 330 may include a single layer or a multi-layer including the above materials. The organic encapsulation layer 320 may include a polymer-based material. The polymer-based material may include an acrylic-based resin, an epoxy-based resin, polyimide, and polyethylene. In an embodiment, the organic encapsulation layer 320 may include acrylate.

A thickness of the first inorganic encapsulation layer 310 may be different from a thickness of the second inorganic encapsulation layer 330. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the thickness of the first inorganic encapsulation layer 310 may be the same as the thickness of the second inorganic encapsulation layer 330.

Referring to the middle area MA of FIG. 11, the middle area MA may include a first sub-middle area SMA1 and a second sub-middle area SMA2, the first sub-middle area SMA1 being relatively distant from the first area OA, and the second sub-middle area SMA2 being relatively close to the first area OA.

Lines, for example, signal lines may be located in the first sub-middle area SMA1. The bypass portions DL-D1 and DL-D2 of the first and second data lines DL1 and DL2 described above with reference to FIG. 10 may be located in the first sub-middle area SMA1 of FIG. 11. The first sub-middle area SMA1 may be a line area and a bypass area in which the data lines DL bypass. The data lines DL located in the middle area MA described with reference to FIG. 10 may include the first data lines DL1 and the second data lines DL2 that are alternately placed on and under the first organic insulating layer 209 with the first organic insulating layer 209 therebetween. With regard to this, it is shown in FIG. 11 that the bypass portion DL-D1 of the first data line DL1 and the bypass portion DL-D2 of the second data line DL2 neighbor each other and are respectively placed on and under the first organic insulating layer 209. In this case, a gap (or a pitch A d) between the first data line DL1 and the second data line DL2 that neighbor each other, for example, between the bypass portion DL-D1 of the first data line DL1 and the bypass portion DL-D2 of the second data line DL2, may be reduced.

Grooves G are located in the second sub-middle area SMA2. The grooves G are located in the multi-layer ML. In an embodiment, as shown in FIGS. 11 and 12A, the multi-layer ML may include the first organic insulating layer 209, the second organic insulating layer 211, and an inorganic layer 213. The first organic insulating layer 209 and the second organic insulating layer 211 may respectively correspond to the first sub-bottom layer and the second sub-bottom layer of the multi-layer ML described with reference to FIGS. 9A and 9B, and the inorganic layer 213 may correspond to the top layer.

The inorganic layer 213 may include a material different from that of the pixel electrode 221. The inorganic layer 213 may include a conductive oxide such as IZO, ITO, ZnO, $In_2O_3$, IGO, and/or AZO, may include a metal such as Mo, Cu, and/or Ti, or may include an insulating material such as silicon nitride, silicon oxide, and/or silicon oxynitride.

Referring to FIG. 12A, the groove G may include a hole 213h of the inorganic layer 213, a hole 211h of the second organic insulating layer 211, and a recess 209r of the first organic insulating layer 209. In this case, a bottom surface of the groove G may be located between a top surface and a bottom surface of the first organic insulating layer 209. In some other embodiments, the first organic insulating layer 209 may include a hole passing through the first organic insulating layer 209 instead of the recess 209r. In this case, the bottom surface of the groove G may be placed on the same surface as the bottom surface of the first organic insulating layer 209 or a top surface of the second interlayer insulating layer 207.

The inorganic layer 213 may include a pair of tips PT extending toward the groove G. A protruding length dl of the tip PT may be less than about 2 μm as described above. A depth d of the groove G may be 2 μm or more, 2.5 μm or more, 3 μm or more, or 3.5 μm or more.

A partition wall PW may be located in the middle area MA. The partition wall PW may be located between grooves G that neighbor each other. The partition wall PW may be formed while a portion 211P of a layer constituting the second organic insulating layer 211, a portion 215P of a layer constituting the pixel-defining layer 215, and a portion 217P of a layer constituting the spacer 217 are sequentially stacked (e.g., arranged). A height from a top surface of the substrate 100 to a top surface of the partition wall PW may be less than a height from the top surface of the substrate 100 to a top surface of the spacer 217.

The intermediate layer MA may include an inorganic contact region ICR. The inorganic contact region ICR may be located between the grooves G that neighbor each other. The inorganic contact region ICR is a region in which layers including an inorganic material directly contact each other. It is shown in FIG. 11 that the inorganic layer 213 directly contacts the second interlayer insulating layer 207. The inorganic layer 213 may contact the second interlayer insulating layer 207 through openings 209OP and 211OP respectively located in the first organic insulating layer 209 and the second organic insulating layer 211.

A first groove G1, a second groove G2, and a third groove G3 are formed before a process of forming the intermediate layer 222 is performed. The first functional layer 222a, the second functional layer 222c, the opposite electrode 223, and the capping layer 230 may be disconnected or separated by the grooves G as described above with reference to FIGS. 11 and 12A-12B.

Referring to FIG. 12C, the first inorganic encapsulation layer 310, the organic encapsulation layer 320, and the second inorganic encapsulation layer 330 may be sequentially formed. The first inorganic encapsulation layer 310 may be formed by chemical vapor deposition, etc. Unlike the first functional layer 222a, the second functional layer 222c, the opposite electrode 223, and the capping layer 230, the first inorganic encapsulation layer 310 has a relatively large (e.g., excellent) step coverage. Therefore, as shown in FIGS. 11, 12C, and 13, the first inorganic encapsulation layer 310 may continuously cover an inner surface of the first groove G1. For example, the first inorganic encapsulation layer 310 may continuously extend so as to cover a top surface, a lateral surface, and a bottom surface of the inorganic layer 213, a lateral surface of the second organic insulating layer 211, and a lateral surface of the first organic insulating layer 209.

As shown in FIG. 13, a first thickness t1 of a first portion of the first inorganic encapsulation layer 310 on a top surface of the inorganic layer 213 may be greater than a second thickness t2 of a second portion of the first inorganic encapsulation layer 310 under a bottom surface of the inorganic layer 213. Also, the first thickness t1 may be greater than a third thickness t3 of a third portion of the first inorganic encapsulation layer 310 on a lateral surface of the second organic insulating layer 211.

The first inorganic encapsulation layer 310 may include a single layer or a plurality of sub-layers. For example, the first inorganic encapsulation layer 310 may include two layers of silicon oxynitride that have different membranous materials. In such a case, the capping layer 230 may be omitted. Alternatively, the first inorganic encapsulation layer 310 may include silicon oxynitride and silicon oxide, silicon oxynitride and silicon nitride, or silicon nitride and silicon oxide.

As shown in FIGS. 11 and 12C, the organic encapsulation layer 320 may cover a portion of the display area DA and the middle area MA. An end of the organic encapsulation layer 320 that neighbors the first area OA may be adjacent to one lateral surface of the partition wall PW.

The second inorganic encapsulation layer 330 is located on the organic encapsulation layer 320 and may directly contact the first inorganic encapsulation layer 310 in the middle area MA. For example, the first inorganic encapsulation layer 310 may directly contact the second inorganic encapsulation layer 330 in an area between the first area OA and the partition wall PW.

Similar to the first inorganic encapsulation layer 310, the second inorganic encapsulation layer 330 may have relatively large (e.g., excellent) step coverage. Therefore, the second inorganic encapsulation layer 330 may continuously cover an inner lateral surface of the grooves G located between the first area OA and the partition wall PW. Similar to the first inorganic encapsulation layer 310 described in FIG. 13, a thickness of a fourth portion of the second inorganic encapsulation layer 330 on a top surface of the inorganic layer 213 may be greater than a thickness of a fifth portion of the second inorganic encapsulation layer 330 under a bottom surface of the inorganic layer 213.

A structure shown in FIG. 11 may be a structure surrounding the first area OA in a plan view. For example, as shown in FIG. 10, the grooves G of FIG. 11 may have a ring shape surrounding the first area OA in a view in a direction perpendicular to the top surface of the substrate 100. Similarly, the partition wall PW may have a ring shape surrounding the first area OA in a view in a direction perpendicular to the top surface of the substrate 100.

Figure 14:
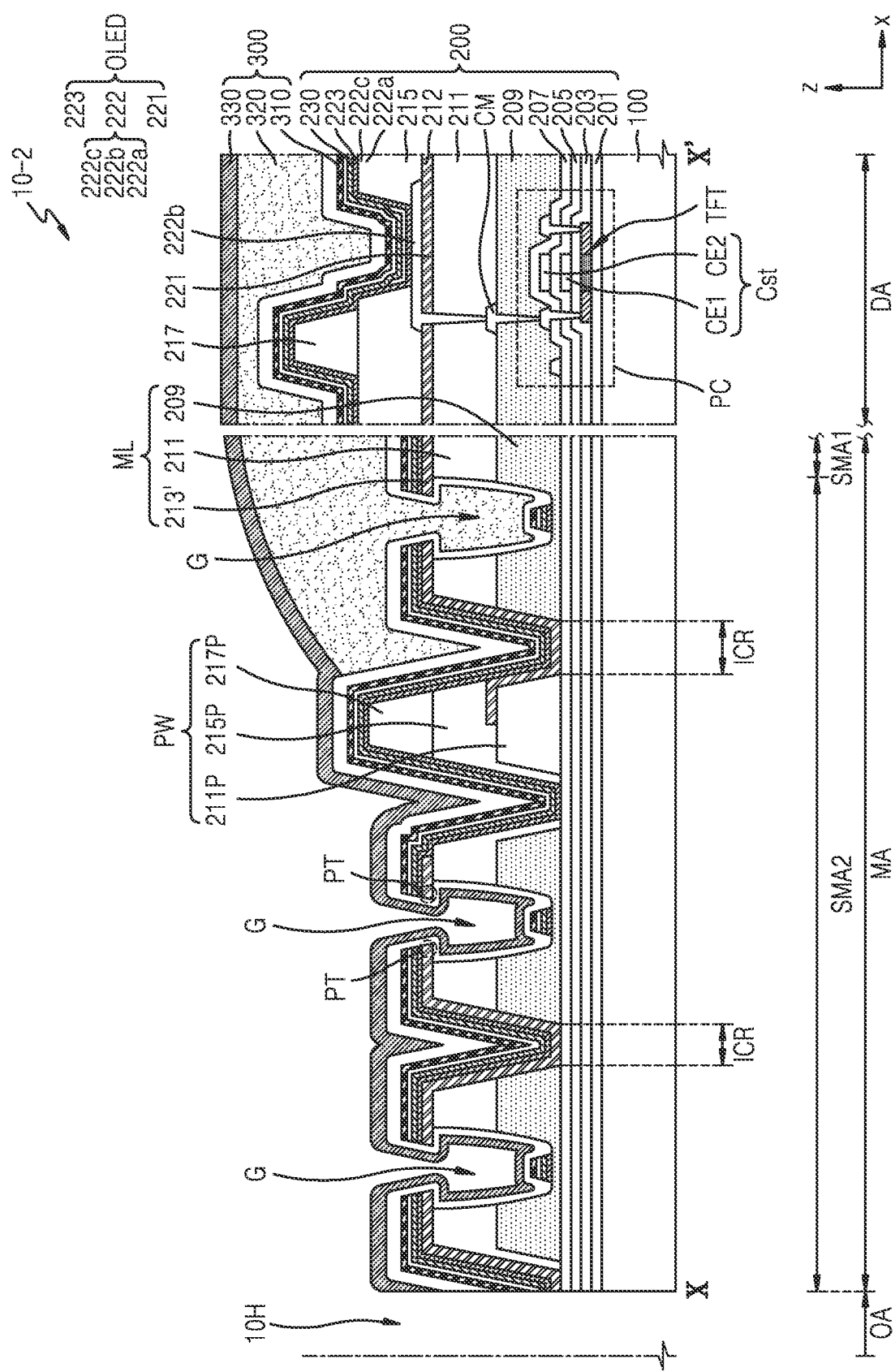
FIG. 14 is a cross-sectional view of a display panel according to some example embodiments.

FIG. 14 is a cross-sectional view of a display panel according to an embodiment, taken along the line X-X' of FIG. 10. A display panel 10-2 of FIG. 14 may have a structure similar to that of the display panel 10-1 described with reference to FIG. 11, etc. A difference is mainly described below.

Referring to FIG. 14, a multi-layer ML of the display panel 10-2 may include the first organic insulating layer 209, the second organic insulating layer 211, and an inorganic layer 213'. The inorganic layer 213' may include an inorganic insulating material such as silicon nitride, silicon oxide, and silicon oxynitride. The first organic insulating layer 209 and the second organic insulating layer 211 may respectively correspond to the first sub-bottom layer and the second sub-bottom layer of the multi-layer ML described with reference to FIGS. 9A and 9B, and the inorganic layer 213' may correspond to the top layer.

The inorganic layer 213' is located in the display area DA and may be formed during the same process as a process of forming a passivation layer 212 including an inorganic insulating material. The inorganic layer 213' includes a pair of tips PT extending toward the groove G, and a protruding length of the tip PT and structural characteristics of the groove G such as a depth of the groove G are the same as those described above.

The middle area MA may include a plurality of inorganic contact regions ICR. With regard to this, FIG. 14 shows an inorganic contact region ICR that neighbors the partition wall PW, and an inorganic contact region ICR between grooves G that neighbor each other. The plurality of inorganic contact regions ICR described with reference to FIG. 14 are applicable to the embodiments described with reference to FIG. 11, embodiments described with reference to FIGS. 15-19, and embodiments derived therefrom.

Though it is shown in FIG. 14 that the passivation layer 212 located in the display area DA is located on the second organic insulating layer 211, the passivation layer 212 may be located under the second organic insulating layer 211 in some other embodiments.

Figure 15:
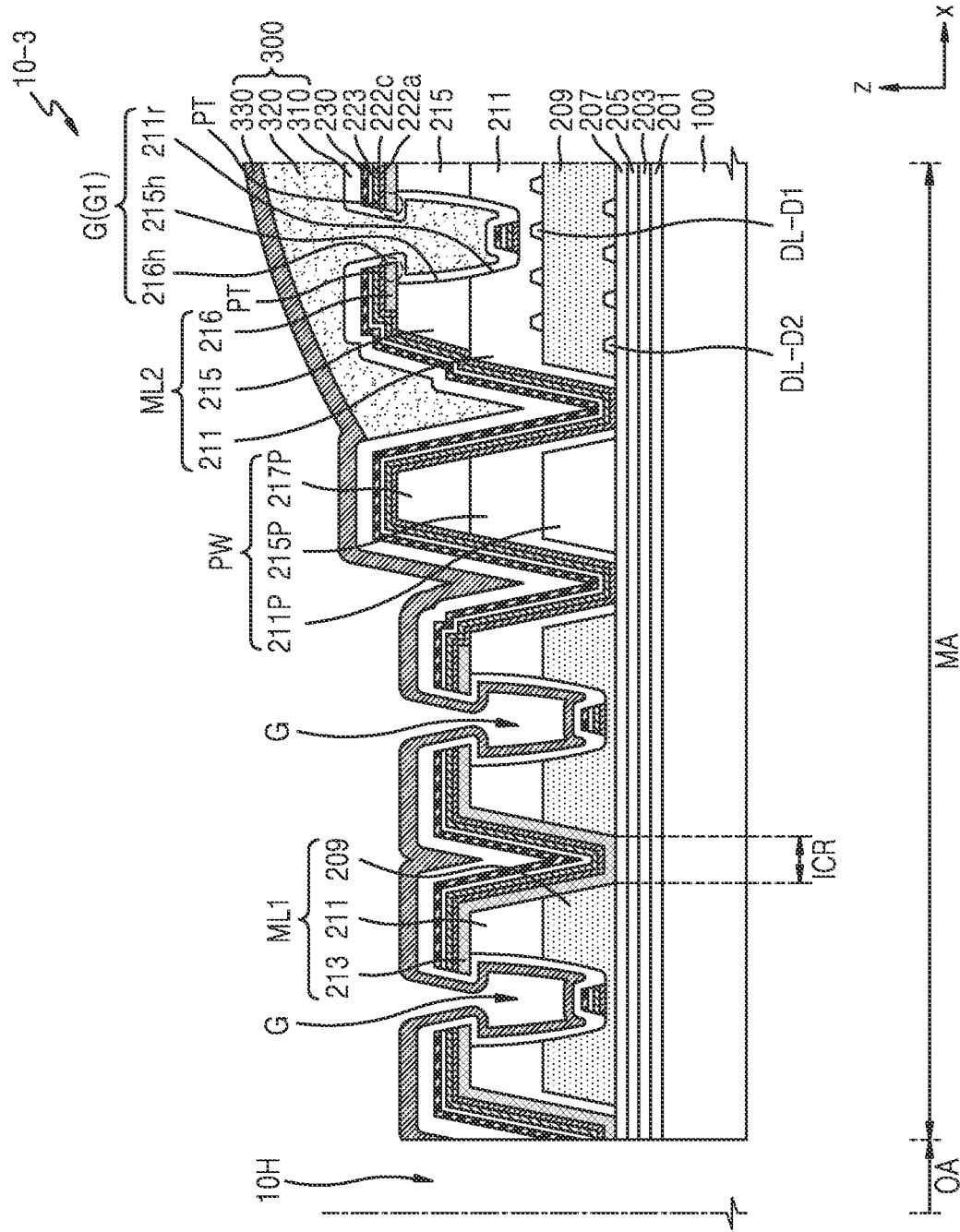
FIG. 15 is a cross-sectional view of a first area and an middle area in a display panel according to an embodiment.

FIG. 15 is a cross-sectional view of the first area OA and the middle area MA in a display panel 10-3 according to an embodiment, taken along the line X-X' of FIG. 10. The display panel 10-3 shown in FIG. 15 includes a plurality of grooves G located in the middle area MA, and a first groove G1 among the plurality of grooves G that neighbors the display area DA may be located over signal lines. With regard to this, it is shown in FIG. 15 that the first groove G1 overlaps the bypass portions DL-D1 and DL-D2 of the data lines extending along the edge of the first area OA.

The grooves G located between the first area OA and the first groove G1 may be defined in a multi-layer different from that of the first groove G1. The grooves G except for the first groove G1 may be in a multi-layer (referred to as a first multi-layer ML1, hereinafter) including the first organic insulating layer 209, the second organic insulating layer 211, and the inorganic layer 213. A specific structure thereof is the same as that described with reference to FIGS. 11-13.

The first groove G1 may be in a multi-layer (referred to as a second multi-layer ML2, hereinafter) including the second organic insulating layer 211, the pixel-defining layer 215, and an inorganic layer 216. The second organic insulating layer 211 and the pixel-defining layer 215 may correspond to the bottom layer described with reference to FIGS. 9A and 9B, and the inorganic layer 216 may correspond to the top layer.

The pixel-defining layer 215 may include an organic insulating material, and the inorganic layer 216 may include a conductive oxide such as IZO, or include an inorganic insulating material such as silicon nitride. Alternatively, the inorganic layer 216 may include a metal such as Mo and Ti. The inorganic layer 216 of the second multi-layer ML2 may include a material that is the same as or different from a material of the inorganic layer 213 of the first multi-layer ML1.

The first groove G1 may include a hole 216h of the inorganic layer 216, a hole 215h of the pixel-defining layer 215, and a recess 211r of the second organic insulating layer 211. The inorganic layer 216 may include a pair of tips PT extending toward a center of the first groove G1. A protruding length of the tip PT and the depth of the first groove G1 are the same as those described with reference to FIG. 9A.

Figure 16:
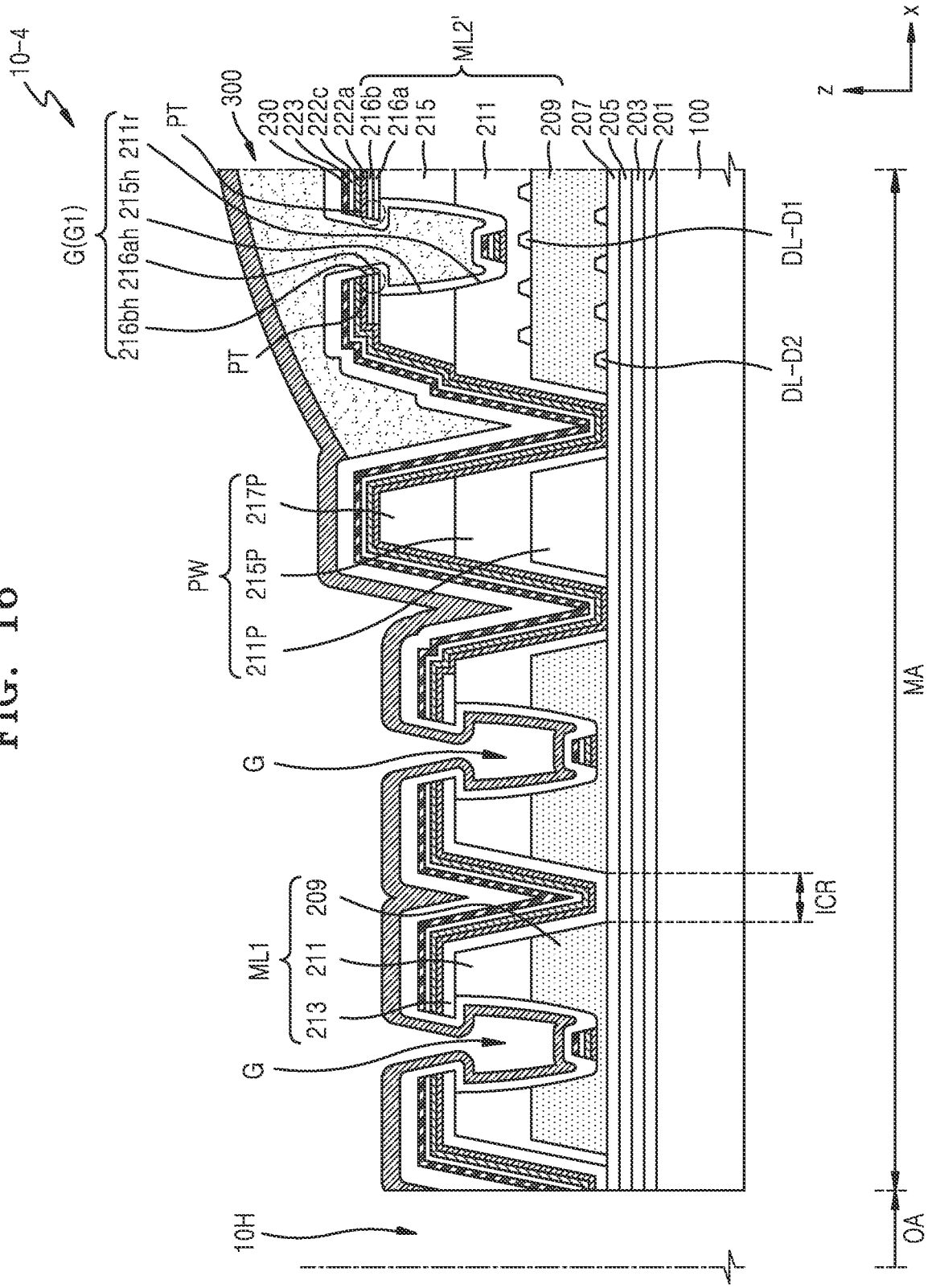
FIG. 16 is a cross-sectional view of a first area and an middle area in a display panel according to some example embodiments.

FIG. 16 is a cross-sectional view of the first area OA and the middle area MA in a display panel 10-4 according to an embodiment, taken along the line X-X' of FIG. 10. Because the display panel 10-4 of FIG. 16 is different from the display panel 10-3 shown in FIG. 15 in the structure of the first groove G1, a difference is mainly described.

The first groove G1 is located in a second multi-layer ML2', and a top layer of the second multi-layer ML2' may include a plurality of inorganic layers. With regard to this, it is shown in FIG. 16 that the second multi-layer ML2' includes the second organic insulating layer 211, the pixel-defining layer 215, a first inorganic layer 216a, and a second inorganic layer 216b. As described with reference to FIG. 9F, the second organic insulating layer 211 and the pixel-defining layer 215 may correspond to the bottom layer, and the first inorganic layer 216a and the second inorganic layer 216b may correspond to the top layer. Though it is shown in FIG. 16 that the top layer includes two layers including the first inorganic layer 216a and the second inorganic layer 216b, the top layer may include three or more inorganic layers as described with reference to FIG. 9F.

The first groove G1 may include a hole 216*bh* of the second inorganic layer 216*b*, a hole 216*ah* of the first inorganic layer 216*a*, the hole 215*h* of the pixel-defining layer 215, and the recess 211*r* of the second organic insulating layer 211. As described with reference to FIG. 15, the first groove G1 may overlap the bypass portions DL-D1 and DL-D2 of the first and second data lines.

The first inorganic layer 216*a* may include a material different from that of the second inorganic layer 216*b*. For example, the first inorganic layer 216*a* may include a conductive oxide such as IZO, and the second inorganic layer 216*b* may include an insulating material such as silicon nitride. The first inorganic layer 216*a* and the second inorganic layer 216*b* may include tips PT protruding toward a center of the first groove G1, and conditions for a protruding length of the tip PT and the depth of the first groove G1 are the same as those described above.

Thought it is shown in FIG. 16 that the inorganic layer 213, which is a top layer of the first multi-layer ML1, includes a single layer, the inorganic layer 213 may include two or more layers in some other embodiments. A top layer of the second multi-layer ML2' and a top layer of the first multi-layer ML1 may have different stacked structures or include different materials. In an embodiment, the top layer of the second multi-layer ML2' may include two sub-layers including the first inorganic layer 216*a* and the second inorganic layer 216*b*, but the inorganic layer 213, which is the top layer of the first multi-layer ML1, may include one or three or more sub-layers.

The above-described characteristics described with reference to FIGS. 15 and 16, for example, a characteristic in which the first groove G1 that neighbors the display area DA is located on a layer different from a layer on which other grooves G are placed, a characteristic in which the first groove G1 overlaps wirings, and a structure of the second multi-layers ML2 and ML2' are applicable to the embodiments described with reference to FIGS. 8-14, embodiments described below with referenced to FIGS. 17-19, and embodiments derived therefrom.

Figure 17:
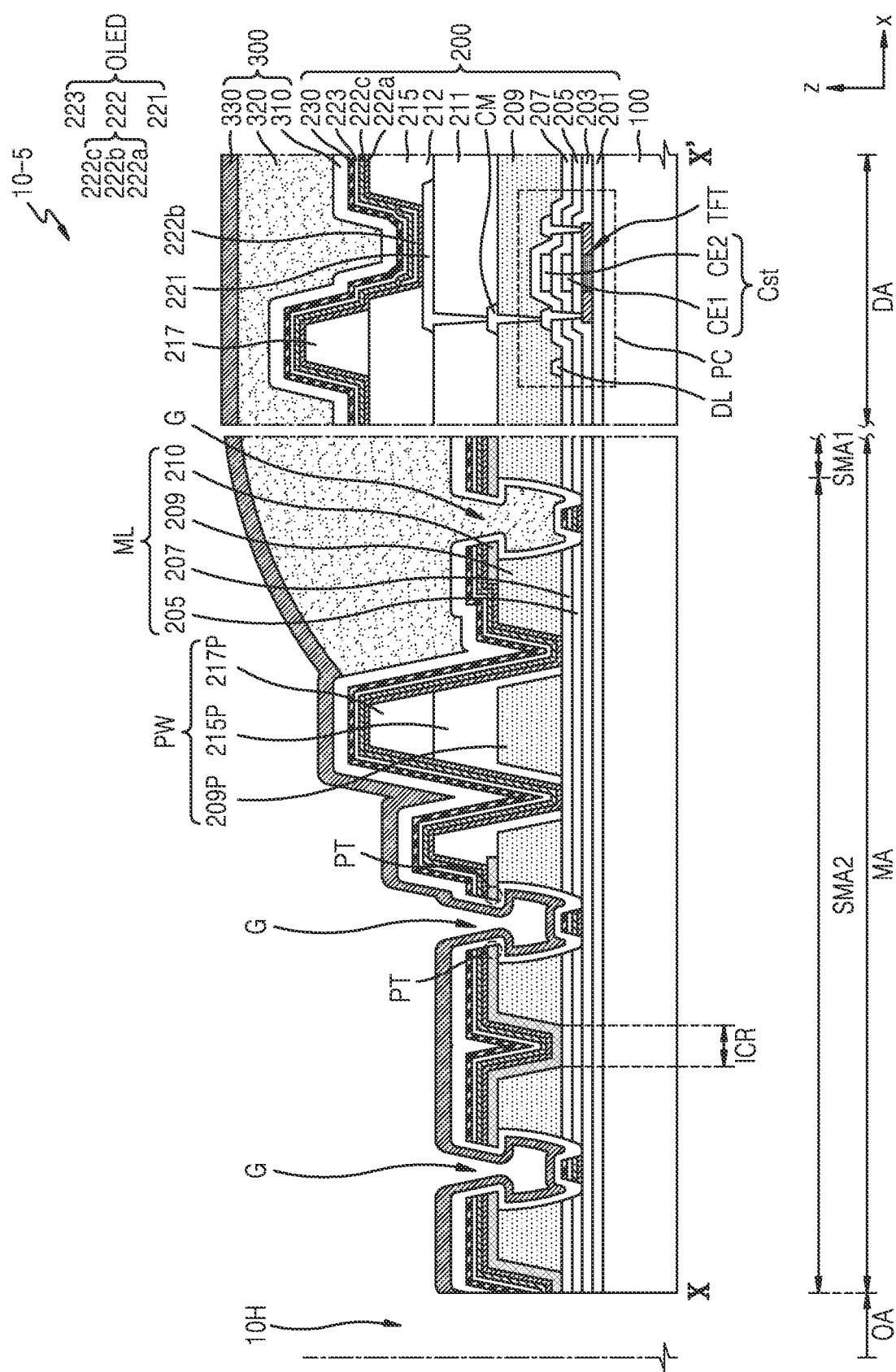
FIG. 17 is a cross-sectional view of a display panel according to some example embodiments.

FIG. 17 is a cross-sectional view of a display panel 10-5 according to an embodiment. FIG. 17 may correspond to a cross-section taken along the line X-X' of FIG. 10.

Referring to FIG. 17, the display panel 10-5 includes the grooves G in the multi-layer ML. The multi-layer ML may include the first organic insulating layer 209, the second interlayer insulating layer 207, the first interlayer insulating layer 205, and the inorganic layer 210. The first organic insulating layer 209, the second interlayer insulating layer 207, and the first interlayer insulating layer 205 may respectively correspond to the first sub-bottom layer, the second sub-bottom layer, and the second sub-bottom layer of the multi-layer described with reference to FIG. 9C, and the inorganic layer 210 may correspond to the top layer.

The inorganic layer 210 may include a material different from those of the data line DL and the contact metal layer CM, the contact metal layer CM connecting the thin film transistor TFT to the pixel electrode 221. The inorganic layer 210 may include an insulating material such as silicon nitride, silicon oxide, and silicon oxynitride. Alternatively, the inorganic layer 210 may include a conductive oxide such as IZO. Alternatively, the inorganic layer 210 may include a metal such as Mo and Ti.

The inorganic layer 210 may include a pair of tips PT extending toward a center of the groove G, and characteristics for a protruding length of the tip PT and the depth of the groove G are the same as those described above.

Though it is shown in FIG. 17 that the bottom layer of the multi-layer ML include three sub-layers, the embodiments are not limited thereto. In some other embodiments, the bottom layer of the multi-layer ML may include two sub-layers including the first organic insulating layer 209 and the second interlayer insulating layer 207. Alternatively, the bottom layer of the multi-layer ML may further include the gate insulating layer 203 in addition to the sub-layers of FIG. 17.

The partition wall PW located in the middle area MA may be formed while a portion 209P of a layer including the first organic insulating layer 209, a portion 215P of a layer including the pixel-defining layer 215, and a portion 217P of a layer including the spacer 217 are sequentially stacked. The structure of the partition wall PW shown in FIG. 17 is applicable to the embodiments described with reference to FIGS. 11-16, embodiments described below with reference to FIG. 19, and/or embodiments derived therefrom.

Figure 18:
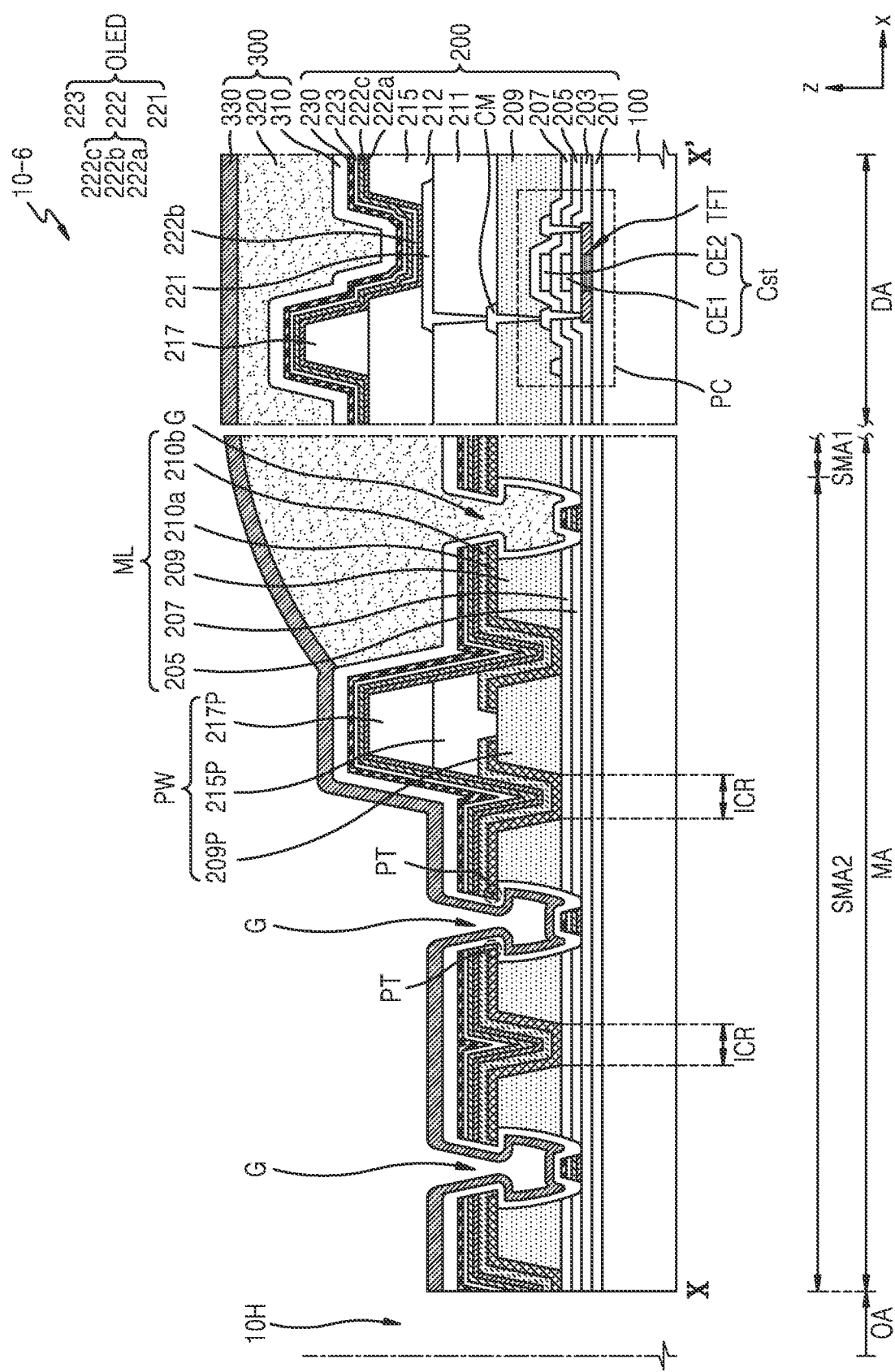
FIG. 18 is a cross-sectional view of a display panel according to some example embodiments.

FIG. 18 is a cross-sectional view of a display panel 10-6 according to an embodiment. FIG. 18 may correspond to a cross-section taken along the line X-X' of FIG. 10. Because the display panel 10-6 of FIG. 18 is different from the display panel 10-5 shown in FIG. 17 in the structure of the top layer of the multi-layer ML, a difference is mainly described below.

Referring to FIG. 18, the multi-layer ML may include the first organic insulating layer 209, the second interlayer insulating layer 207, the first interlayer insulating layer 205, the first inorganic layer 210*a*, and the second inorganic layer 210*b*. The first organic insulating layer 209, the second interlayer insulating layer 207, and the first interlayer insulating layer 205 may respectively correspond to the first sub-bottom layer, the second sub-bottom layer, and the second sub-bottom layer. The first inorganic layer 210*a* and the second inorganic layer 210*b* may respectively correspond to the first sub-top layer and the second sub-top layer. Though it is shown in FIG. 18 that the bottom layer of the multi-layer ML includes three sub-layers, the bottom layer may include a single layer as described with reference to FIG. 9E in some other embodiments. In this case, the bottom layer of the multi-layer ML may include the first organic insulating layer 209, which is a bottom layer, the first inorganic layer 210*a*, and the second inorganic layer 210*b*, which are top layers.

The first inorganic layer 210*a* may include the same material as that of the contact metal layer CM. For example, the first inorganic layer 210*a* may have a structure of Ti/Al/Ti that are sequentially stacked. The second inorganic layer 210*b* may include an insulating material such as silicon nitride, silicon oxide, and silicon oxynitride.

A lateral surface of the first inorganic layer 210*a* facing a center of the groove G may be covered by the second inorganic layer 210*b*. The first inorganic layer 210*a*, which has a three-layered structure of Ti/Al/Ti, may be formed during the same mask process as a process of forming the contact metal layer CM. The second inorganic layer 210*b* may prevent or reduce damage to the first inorganic layer 210*a*. For example, in the case where the first inorganic layer 210*a* includes a multi-layer including aluminum, which may be damaged during a process, and titanium, which may not be damaged during a process, a lateral surface of the first inorganic layer 210*a* may be made not to include unevenness by reducing or preventing damage to aluminum.

The top layer including the first inorganic layer 210*a* and the second inorganic layer 210*b* may include a pair of tips PT. Characteristics for a protruding length of the tip PT and the depth of the groove G are the same as those described above.

Though it is shown in FIG. 18 that the bottom layer of the multi-layer ML includes three sub-layers, the embodiments are not limited thereto. In some other embodiments, the bottom layer of the multi-layer ML may include two sub-layers including the first organic insulating layer 209 and the second interlayer insulating layer 207. Alternatively, the bottom layer of the multi-layer ML may further include the gate insulating layer 203 in addition to the sub-layers of FIG. 18.

Figure 19:
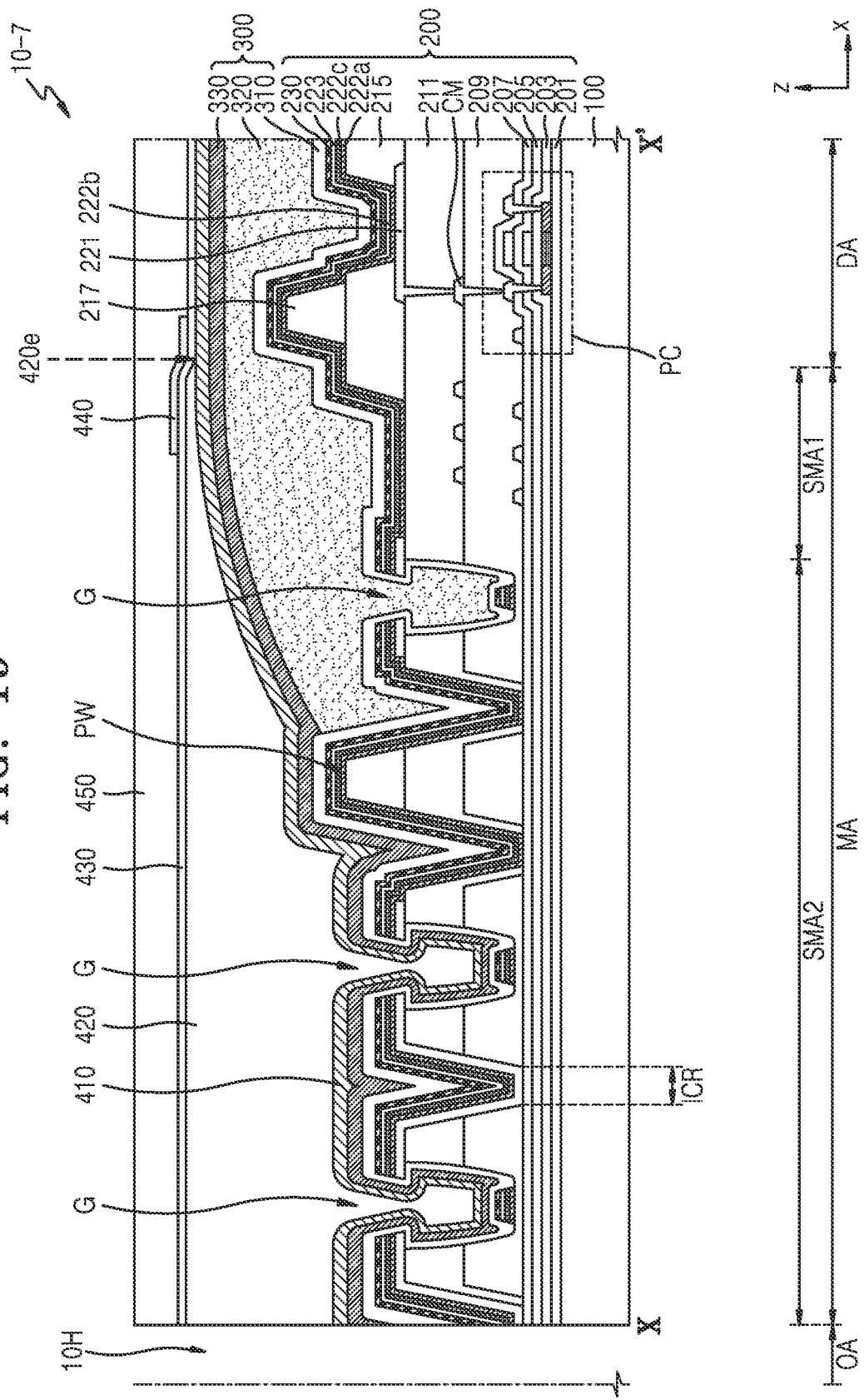
FIG. 19 is a cross-sectional view of a display panel according to some example embodiments.
Figure 20:
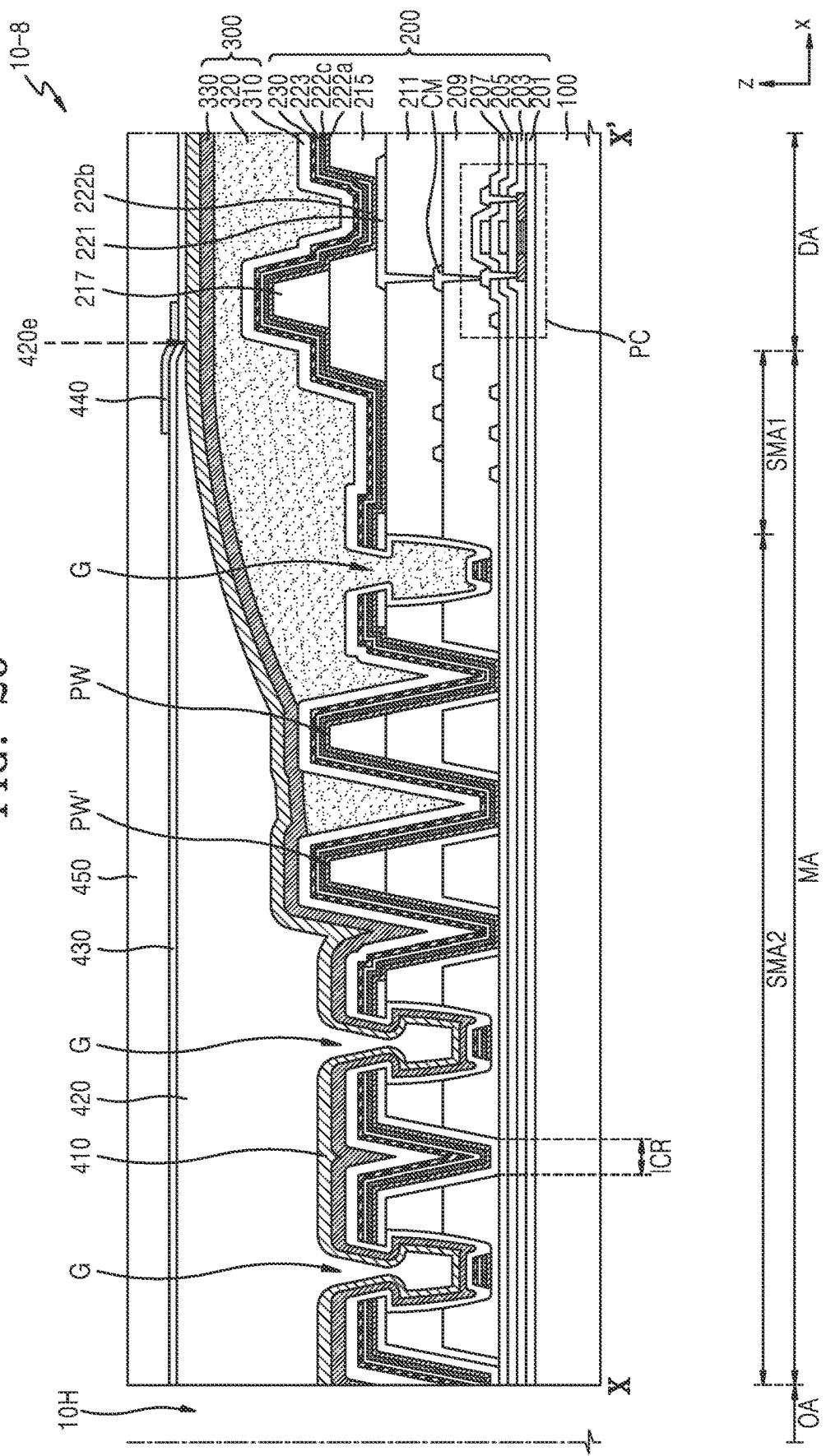
FIG. 20 is a cross-sectional view of a display panel according to some example embodiments.

FIG. 19 is a cross-sectional view of a display panel 10-7 according to an embodiment, and FIG. 20 is a cross-sectional view of a display panel 10-8 according to an embodiment. FIGS. 19 and 20 may correspond to cross-sections taken along the line X-X' of FIG. 10.

The display panel 10-7 of FIG. 19 and the display panel 10-8 of FIG. 20 may include a planarization organic material layer 420 located on the thin-film encapsulation layer 300 in the middle area MA. In an embodiment, a structure of the display panel 10-7 ranging from the substrate 100 to the thin-film encapsulation layer 300 is the same as that described above with reference to FIG. 11. In some other embodiments, as shown in FIG. 20, the display panel 10-8 may include a plurality of partition walls PW and PW in the middle area MA. A groove may not be located between the plurality of partition walls PW and PW. Alternatively, a groove may be located between the plurality of partition walls PW and MN. The plurality of partition walls PW and MAP may control a flow of a material constituting the organic encapsulation layer 320 during a process of forming the organic encapsulation layer 320 and/or control a height of the organic encapsulation layer 320. With regard to this, though it is shown in FIG. 20 that a portion of the organic encapsulation layer 320 is between the partition walls PW and MAP that neighbor each other, an end of the organic encapsulation layer 320 may be located on one side of the partition wall PW that neighbors the display area DA depending on a flow control condition in some other embodiments. As shown in FIGS. 19 and 20, the planarization organic material layer 420 may be located in the middle area MA. The planarization organic material layer 420 may be located in only the intermediated area MA, for example, between the first area OA and the display area DA. The planarization organic material layer 420 may include an organic insulating layer. The planarization organic material layer 420 may include a polymer-based material. For example, the planarization organic material layer 420 may include a silicon-based resin, an acrylic-based resin, an epoxy-based resin, polyimide, and polyethylene. In an embodiment, the planarization organic material layer 420 may include a material different from that of the organic encapsulation layer 320.

The planarization organic material layer 420 may cover at least one groove G located in the middle area MA. The planarization organic material layer 420 may increase flatness of the display panel 10-7 around the first area OA by covering a region of the middle area MA that is not covered by the organic encapsulation layer 320. Therefore, separation or falling apart of the input sensing layer 40 (see FIG. 2 or 3) and/or the optical functional layer 50 (see FIG. 2 or 3) on the display panel 10-7 may be reduced or prevented. A portion of the planarization organic material layer 420 may overlap the organic encapsulation layer 320. One edge of the planarization organic material layer 420, for example, a first edge 420e that neighbors the display area DA may be located on the second inorganic encapsulation layer 330.

The planarization organic material layer 420 may be located in the middle area MA during an exposure and developing process. In the case where external foreign substances, for example, moisture progresses in a lateral direction (or a direction parallel to the top surface of the substrate 100, an x-direction) of the display panel 10-7 during some processes (e.g., a washing process) among processes of forming the planarization organic material layer 420, an organic light-emitting diode OLED in the display area DA may be damaged. However, because insulating layers, for example, a first insulating layer 410 and a second insulating layer 430 are respectively arranged or placed under and on the planarization organic material layer 420, the issue related to moisture penetration and/or floating of a layer located around the planarization organic material layer 420 may be reduced or prevented during and after a process of forming the planarization organic material layer 420.

The first insulating layer 410 and the second insulating layer 430 may respectively directly contact a bottom surface and a top surface of the planarization organic material layer 420. The first insulating layer 410 and the second insulating layer 430 may include an inorganic insulating material such as silicon oxide, silicon nitride, or silicon oxynitride. The first insulating layer 410 and the second insulating layer 430 each may include a single layer or a multi-layer including the above materials.

The planarization organic material layer 420 may form a step difference with a layer(s) thereunder. A portion of the planarization organic material layer 420 that includes the first edge 420e may form a step difference with a top surface of the first insulating layer 410. To reduce or prevent an issue that the planarization organic material layer 420 is separated or floated from a layer thereunder due to the above-described step difference during and/or after a process of manufacturing the display panel 10-7, a cover layer 440 may be located on the first edge 420e.

The cover layer 440 may include a metal. The first insulating layer 410, the second insulating layer 430, and a third insulating layer 450 described below each extend to not only the intermediate layer MA but also the display area DA. In contrast, the cover layer 440 may cover the first edge 420e of the planarization organic material layer 420 with a set or predetermined width. The cover layer 440 on the planarization organic material layer 420 may extend toward the display area DA beyond the first edge 420e, but does not extend toward the display area DA.

The third insulating layer 450 may be located on the cover layer 440. The third insulating layer 450 may include an organic insulating material. For example, an organic insulating material of the third insulating layer 450 may include a photoresist (e.g., a negative or positive photoresist) or a polymer-based organic material, and may extend toward the display area DA so as to cover the display area DA.

The structure shown in FIGS. 19 and 20 is equally applicable to the embodiments described with reference to FIGS. 13-18 and embodiments derived therefrom.

Though it is shown that each of the display panels described with reference to FIGS. 11-20 includes the first opening 10H corresponding to the first area OA, and the substrate 100 also includes a through hole corresponding to the first area OA, the embodiments are not limited thereto. In some other embodiments, as described with reference to FIG. 4B, the display panel may not include a hole passing through the substrate 100.

The display panel according to embodiments may reduce or prevent external impurities such as moisture around the first area from damaging display elements.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

It should be understood that embodiments described herein should be considered in a descriptive sense only and not for purposes of features. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
    a substrate comprising a first area, a second area, and a third area between the first area and the second area;
    a buffer layer on the substrate;
    a transistor on the buffer layer, the transistor being located in the second area;
    a stack structure in the second area, the stack structure comprising a pixel electrode electrically connected to the transistor, an opposite electrode, and an intermediate layer between the pixel electrode and the opposite electrode;
    an encapsulation layer located on the stack structure and comprising at least one inorganic encapsulation layer and an organic encapsulation layer;
    at least one partition wall in the third area; and
    a plurality of grooves in the third area,
    wherein the plurality of grooves comprise a first groove, and a bottom surface of the first groove is located above an upper surface of the buffer layer.

2. The display panel of claim 1, further comprising an inorganic insulating layer between the buffer layer and the bottom surface of the first groove.

3. The display panel of claim 2, wherein the inorganic insulating layer comprises a same material as a material of a gate insulating layer between a semiconductor layer and a gate electrode of the transistor.

4. The display panel of claim 1, further comprising a multilayer film comprising an organic insulating layer on the buffer layer,
    wherein the plurality of grooves are formed in the multilayer film,
    the organic insulating layer is located in the second area and the third area, and
    in the second area, the organic insulating layer is located on a gate electrode of the transistor.

5. The display panel of claim 4, wherein a metal layer is on the organic insulating layer in the third area, the metal layer comprising a pair of tips protruding toward a center of the first groove.

6. The display panel of claim 5, wherein the metal layer comprises a stack structure of a titanium layer, an aluminum layer, and a titanium layer.

7. The display panel of claim 4, further comprising an interlayer insulating layer between the buffer layer and the organic insulating layer and comprising an inorganic insulating material,
wherein the interlayer insulating layer has a hole corresponding to the first groove.

8. The display panel of claim 1, wherein a portion of the organic encapsulation layer is located in the first groove.

9. The display panel of claim 1, further comprising a planarization layer on the encapsulation layer to overlap a portion of the encapsulation layer in the third area.

10. The display panel of claim 1, wherein the at least one partition wall comprises two partition walls in the third area, and
at least one of the plurality of grooves is located between the two partition walls.

11. An electronic apparatus comprising:
a display panel comprising a first area, a second area, and a third area between the first area and the second area; and
a component located below the display panel and corresponding to the first area,
wherein the display panel comprises:
a substrate;
a buffer layer on the substrate;
a transistor on the buffer layer, the transistor being located in the second area;
a stack structure in the second area, the stack structure comprising a pixel electrode electrically connected to the transistor, an opposite electrode, and an intermediate layer between the pixel electrode and the opposite electrode;
an encapsulation layer located on the stack structure and comprising at least one inorganic encapsulation layer and an organic encapsulation layer;
at least one partition wall in the third area; and
a plurality of grooves in the third area, and
wherein the plurality of grooves comprise a first groove, and a bottom surface of the first groove is located above an upper surface of the buffer layer.

12. The electronic apparatus of claim 11, wherein the component comprises a camera or a sensor.

13. The electronic apparatus of claim 11, wherein the display panel further comprises an inorganic insulating layer between the buffer layer and the bottom surface of the first groove.

14. The electronic apparatus of claim 13, wherein the inorganic insulating layer comprises a same material as a material of a gate insulating layer between a semiconductor layer and a gate electrode of the transistor.

15. The electronic apparatus of claim 11, wherein the display panel further comprises a multilayer film comprising an organic insulating layer on the buffer layer, and
the plurality of grooves are formed in the multilayer film,
the organic insulating layer is located in the second area and the third area, and
in the second area, the organic insulating layer is located on a gate electrode of the transistor.

16. The electronic apparatus of claim 15, wherein a metal layer is on the organic insulating layer in the third area, the metal layer comprising a pair of tips protruding toward a center of the first groove.

17. The electronic apparatus of claim 16, wherein the metal layer comprises a stack structure of a titanium layer, an aluminum layer, and a titanium layer.

18. The electronic apparatus of claim 15, wherein the display panel further comprises an interlayer insulating layer between the buffer layer and the organic insulating layer and comprising an inorganic insulating material, and
the interlayer insulating layer has a hole corresponding to the first groove.

19. The electronic apparatus of claim 11, wherein a portion of the organic encapsulation layer is located in the first groove.

20. The electronic apparatus of claim 11, wherein the display panel further comprises a planarization layer on the encapsulation layer to overlap a portion of the encapsulation layer in the third area.

21. The electronic apparatus of claim 11, wherein the at least one partition wall comprises two partition walls in the third area, and
at least one of the plurality of grooves is located between the two partition walls.

* * * * *